US008749288B2

(12) United States Patent
Randall

(10) Patent No.: US 8,749,288 B2
(45) Date of Patent: Jun. 10, 2014

(54) PROPORTIONAL REMOTE CONTROL

(76) Inventor: Mitch Randall, Boulder, CO (US)

(*) Notice: Subject to any disclaimer, the term of this patent is extended or adjusted under 35 U.S.C. 154(b) by 542 days.

(21) Appl. No.: 13/160,374

(22) Filed: Jun. 14, 2011

(65) Prior Publication Data
US 2011/0309771 A1 Dec. 22, 2011

Related U.S. Application Data

(60) Provisional application No. 61/355,972, filed on Jun. 17, 2010, provisional application No. 61/355,950, filed on Jun. 17, 2010, provisional application No. 61/355,963, filed on Jun. 17, 2010.

(51) Int. Cl.
H03K 3/00 (2006.01)
(52) U.S. Cl.
USPC ............ 327/291; 315/307; 361/287; 323/290
(58) Field of Classification Search
None
See application file for complete search history.

(56) References Cited

U.S. PATENT DOCUMENTS

| 5,469,632 | A | 11/1995 | Boenning |
| 5,804,709 | A | 9/1998 | Bourgoin et al. |
| 7,416,310 | B1 | 8/2008 | Savicki, Jr. |
| 7,495,478 | B2* | 2/2009 | Takeuchi et al. ............... 327/51 |
| 2002/0008567 | A1 | 1/2002 | Henry |
| 2006/0202764 | A1* | 9/2006 | Fukuda et al. ............... 330/296 |
| 2008/0297069 | A1 | 12/2008 | Shao et al. |
| 2011/0309771 | A1* | 12/2011 | Randall ......................... 315/307 |
| 2012/0299439 | A1* | 11/2012 | Huang ........................... 310/309 |
| 2013/0109990 | A1* | 5/2013 | Akingba et al. ............... 600/529 |

OTHER PUBLICATIONS

International Search Report / PCT/US2011/040382 / Dec. 5, 2011.

* cited by examiner

Primary Examiner — Lincoln Donovan
Assistant Examiner — Khareem E Almo
(74) Attorney, Agent, or Firm — James R. Young; William W. Cochran; Cochran Freund & Young LLC

(57) ABSTRACT

Disclosed is a proportional controller that utilizes a deflected metal cantilever that provides a progressive change in capacitance for a given deflection that is used to generate a proportional control signal. In addition, a efficient step-up converter 1500 is disclosed, which is capable of operating with a single alkaline cell. Further, a LED drive circuit is disclosed that has high efficiency and is capable of driving an infrared LED with a single alkaline cell.

26 Claims, 21 Drawing Sheets

PROPORTIONAL REMOTE CONTROL

CROSS-REFERENCE TO RELATED APPLICATIONS

The present application is based upon and claims the benefit of U.S. Provisional patent application No. 61/355,972, titled "Method and Apparatus for Driving Infrared LED's in Remote Controls," filed Jun. 17, 2010, by Mitchell Alfred Randall, U.S. Provisional patent application No. 61/355,950, titled "Method and Apparatus for Proportional Remote Control," filed Jun. 17, 2010, by Mitchell Alfred Randall, and U.S. Provisional patent application No. 61/355,963, titled "Method and Apparatus for Inexpensive Electrical Step-up Converter," filed Jun. 17, 2010, by Mitchell Alfred Randall. The entire content of the above-mentioned applications are hereby specifically incorporated herein by reference for all they disclose and teach.

BACKGROUND

Remote control devices are used for sending control commands to remotely controlled devices, which is a separate apparatus from the remote control device. Remotely controlled devices are equipped with the ability to receive, interpret and act upon information transmitted by a remote control device. An example of a remotely controlled device is a toy vehicle that receives information sent by a remote control device to control the drive motor and steering servo of the remotely controlled device. It is desirable to have a remote control device that is a proportional remote control device. The term proportional, as used herein, indicates that commands are sent which are not simply on/off commands, but form a continuum or scale of control. The value of a particular command is related to the degree that a mechanical input device of the remote control is deflected. Mechanical input devices can include joysticks or other mechanical devices for creating a continuum of control. A command associated with the position of a joystick may or may not be strictly proportional to the deflection of the joystick. In general, however, the command signal generated is a continuous function of the position of the joystick, so as to constitute a proportional control. Proportional controls allow a more precise and natural control of a remotely controlled device than on/off controls. For example, a joystick may produce a proportional control signal relating to the speed of a remotely controlled vehicle. Non-proportional devices generate control signals that constitute either a stop or full speed command. A proportional controller, on the other hand, allows the operator to move the joystick to obtain intermediate vehicle speeds. In some cases, the command signal is a discretized signal relating to the position of the joystick. In that regard, a discretized signal is a function of the position of the joystick, which is quantized into small, discrete steps.

SUMMARY

An embodiment of the present invention may therefore comprise a variable capacitor comprising: a printed circuit board having a predetermined dielectric coefficient; a metal pad disposed on a first side of the printed circuit board; a metal cantilever disposed on a second side of the printed circuit board that is attached to the printed circuit board at a first end of the metal cantilever, the metal cantilever having a predetermined elasticity; a deflector disposed to engage the metal cantilever so that the predetermined elasticity of the deflector is sufficient to hold the deflector in a neutral position when a deflection force is not applied to the deflector, and disposed to deflect the metal cantilever when a force is applied to the deflector which causes the metal cantilever to deflect away from the printed circuit board in a curvature that produces a progressive, measurable charge in capacitance over a full range of deflection of the deflector.

An embodiment of the present invention may further comprise a remote control comprising: a variable capacitor comprising: a substrate; a metal pad disposed on a first side of the substrate, and a metal cantilever disposed on a second side of the substrate; at least one deflector having a deflector portion that engages the metal cantilever and causes the metal cantilever to deflect from the substrate in curved shape; an electronic controller that generates a discharge signal and a periodic charge signal that is applied to the variable capacitor; a charge pump that accumulates a charge from periodic charge signal comprising a plurality of pulse charges that are applied to the variable capacitor up to a threshold level; an electronic controller that generates the periodic charge signal, senses the charge accumulated by the charge pump, and generates a discharge signal that discharges the charge pump when the charge pump reaches aid threshold level, and counts plurality of pulse charges of the periodic charge signal to charge the charge pump to the threshold level, to create an output control signal; an output generator that generates a remote control signal in response to the output control signal.

An embodiment of the present invention may further comprise a method of generating a control signal in a remote controller comprising: deflecting a metal cantilever in a variable capacitance device using a deflector that is coupled to a manual control to adjust capacitance of the variable capacitance device; applying a periodic waveform to the variable capacitance device so that a charge signal is created for each pulse of the periodic waveform; integrating the charge signal for each pulse until a plurality of charge signals creates a cumulative charge signal; detecting when the cumulative charge signal reaches a threshold charge; counting the plurality of charge signals to generate an output signal that is indicative of the capacitance of the variable capacitance device and deflection of the deflector.

An embodiment of the present invention may further comprise a system for generating a control signal in a remote controller comprising: means for deflecting a metal cantilever in a variable capacitance device to adjust capacitance of the variable capacitance device; means for generating a charge signal by applying a periodic waveform to the variable capacitance device; means for integrating the charge signal until a plurality of charge signals creates a cumulative charge signal; means for detecting when the cumulative charge signal reaches a threshold charge; means for counting the plurality of charge signals to generate an output signal that is indicative of the capacitance of the variable capacitance device and deflection of the deflector.

An embodiment of the present invention may further comprise a method of generating an efficient drive signal to drive an LED in an LED drive circuit that is powered by a battery comprising: storing energy from the battery in an inductor by allowing a current to flow from the battery through the inductor to ground potential; periodically interrupting the current flow through the inductor and directing the current flow to the LED to create a high voltage pulse having a predetermined duration; selecting the predetermined duration by selecting an inductive value for the inductor and a peak current generated by the inductor when the current flow through the inductor is interrupted so that a series of short duration, high voltage pulses are generated that have low duty cycles that increase efficiency of the drive signal.

An embodiment of the present invention may further comprise an LED drive current that is powered by a battery that generates a high efficiency LED drive signal comprising: an LED that is connected to the battery; an inductor connected in parallel to the LED so that current flows through the inductor from the battery; a transistor switch connected to a common connection of the LED and the inductor and a ground potential; a controller that generates a periodic signal that is applied to the FET switch to turn the FET switch off and on and periodically interrupts the current that flows through the inductor so that the current flows through the LED in the form of a short duration pulse with a low duty cycle, the duration of the pulse and the efficiency of the LED drive signal being dependent upon an inductive value of the inductor and a voltage level of the battery.

An embodiment of the present invention may further comprise a system for generating an efficient drive signal to drive an LED comprising: inductive means for storing energy from a battery by allowing a current to flow from the battery through the inductive means to a ground potential; means for periodically interrupting the current flow through the inductor and directing the current flow to the LED to create a high voltage pulse having a predetermined duration by selecting an inductive value for the inductive means and a peak current generated by the inductive means when the current flow through the inductor is interrupted, so that a series of short duration, high voltage pluses are generated that have low duty cycles to increase the efficiency of the drive signal.

An embodiment of the present invention may further comprise a method of generating a step-up voltage in a circuit that is powered by a battery comprising: using a pair of transistors that are connected to form a bistable oscillator; using an inductor to store energy from the battery; periodically coupling the inductor to an output capacitor after the inductor has reached a predetermined current load using one of the transistors of the pair of transistors that form the bistable oscillator; storing the energy from the inductor on an output capacitor.

An embodiment of the present invention may further comprise a step-up converter that generates a step-up voltage in a battery powered circuit comprising: a pair of transistors connected to form a bistable oscillator; an inductor connected to the bistable oscillator so that current flows through the inductor from the battery into the bistable oscillator and the bistable oscillator periodically interrupts the current flow into the bistable oscillator; an output capacitor that charges to the step-up voltage; a diode that directs the current flow to the output capacitor when the current flow is interrupted from flowing into the bistable oscillator.

An embodiment of the present invention may further comprise a system for generating a step-up voltage in a circuit that is powered by a battery comprising: means for generating a bistable oscillator; means for using an inductor to store energy from the battery; means for periodically coupling the inductor to an output capacitor after the inductor has reached a predetermined current level using the bistable oscillator; means for storing the energy from the inductor to produce the step-up voltage.

DETAILED DESCRIPTION OF THE EMBODIMENTS

Figure 1:
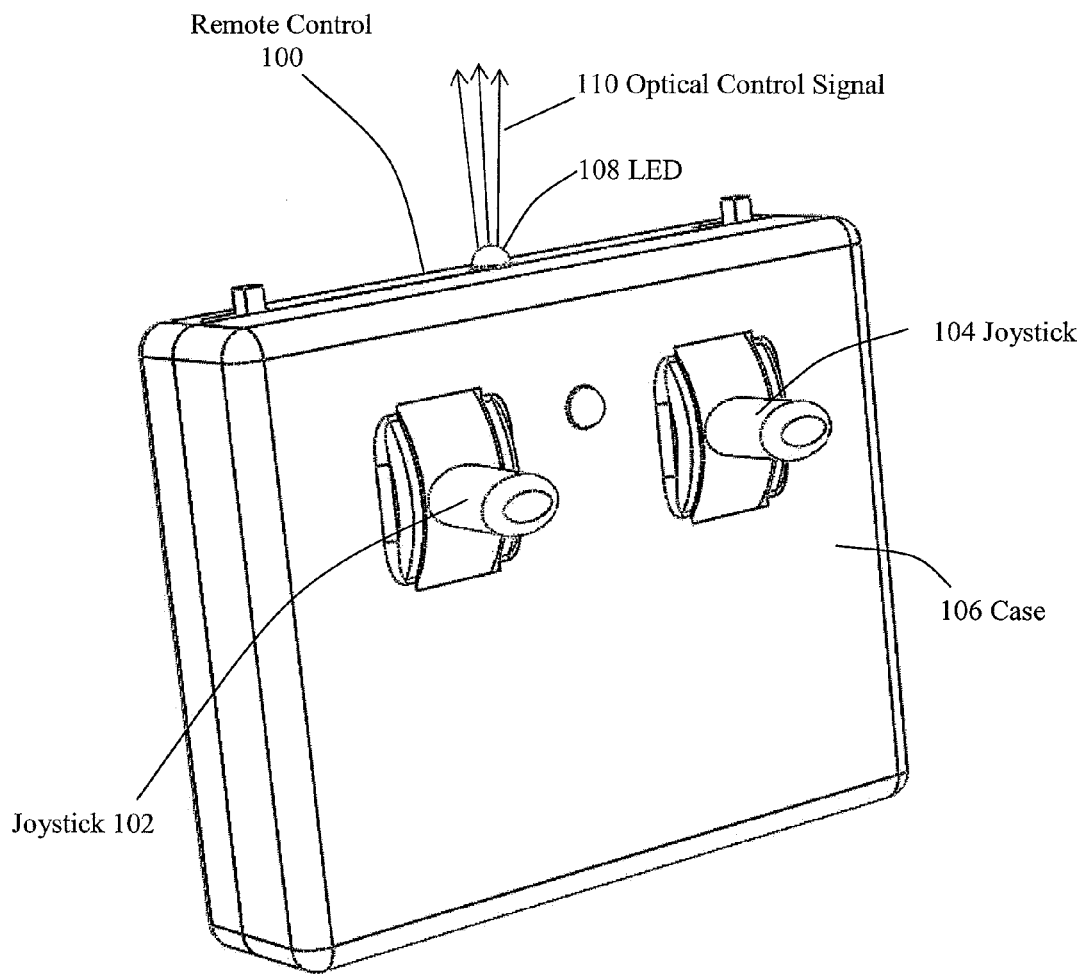
FIG. 1 is perspective view of an embodiment of a proportional remote controller.

FIG. 1 is a perspective view of an embodiment of a remote control device 100. The remote control device includes joystick 102 and joystick 104 that are located in case 106. The remote control device 100 is a proportional controller, which generates an optical control signal 110 from LED 108. The optical control signal is transmitted to a remote controlled device (not shown), which operates in response to the optical control signal 110. Although FIG. 1 discloses a particular set of joysticks 102, 104, joysticks can take many different shapes and can pivot or slide linearly, or move in other ways. The embodiment of FIG. 1 is also useful in controllers that use other forms of signaling besides optical, including RF remote controllers and wired remote controllers.

In typical remote control devices, some type of electromechanical sensor is connected to the joystick so that the position of the joystick can be measured. The position-related variable generated is then translated and modulated into a signal that is demodulated by the remote controlled device and translated into an appropriate control signal, such as a throttle control or a steering control for a remotely controlled vehicle. Also, the joystick in typical remote control devices is sometimes spring-loaded so that it returns to a neutral position. For example, it is desirable for a joystick that controls the steering in a remote controlled vehicle to return to a straight steering position when the control is released.

Further, typical position-sensing elements that are used in remote controllers are potentiometers. Potentiometers are expensive compared to the other parts of the remote controller. Further, the position of the potentiometer must be adjusted so that the signal obtained at the neutral position corresponds to a neutral command. The system can be adjusted at the factory or a trim mechanism can be included for adjustment by the user. Otherwise, the neutral position may not result in a neutral command over the life of the remote controller, or at various temperatures of the remote controller. Alternatively, highly accurate measurements of the position of the joystick can avoid the inclusion of a trim feature. However, highly accurate measurement necessitates the inclusion of either an A/D converter or a timing device in which a delay is controlled by the position-sensing element that is associated with the joystick. In either case, the high accuracy that is required from these devices, to avoid the inclusion of a trim feature is costly.

Figure 2:
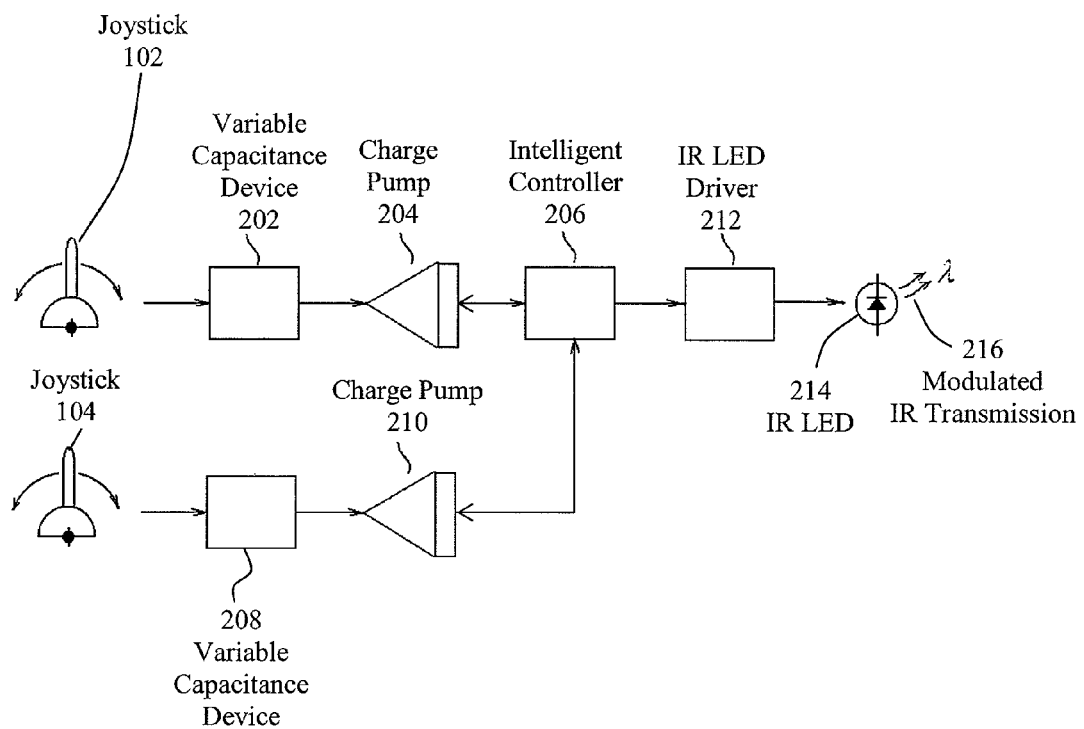
FIG. 2 is a schematic block diagram of an embodiment of the proportional remote controller of FIG. 1.

FIG. 2 is a schematic block diagram that illustrates the components comprising the remote controller 100. As illustrated in FIG. 2, joystick 102 is coupled to a variable capacitance device 202 that has a capacitance that varies with the position of the joystick 102. Charge pump 204 accumulates a charge based upon the capacitance of the variable capacitive device 202. Similarly, joystick 104 is coupled to variable capacitance devices 208 that has a capacitance that varies with the position of joystick 104. Charge pump 210 accumulates charge based upon the capacitance of the variable capacitive device 208. Charge pump 204 and charge pump 210 are coupled to controller 206. Controller 206 generates a control signal that is applied to an infrared LED driver 212. The infrared LED driver 212 generates a signal that drives the infrared LED 214 to produce the modulated IR transmission 216. Intelligent controller 206 generates a command signal based upon the number of pulses required to charge the charge pumps 204, 206 to a threshold level, as explained in more detail below. The command signals generated by the intelligent controller 206 are on/off key modulation signals that indicate the positions of the joysticks 102, 104. These amplitude modulated signals are applied to the infrared LED driver 212. The infrared LED then transmits the amplitude modulated control signal 216 to the remotely controlled device (not shown).

Figure 3:
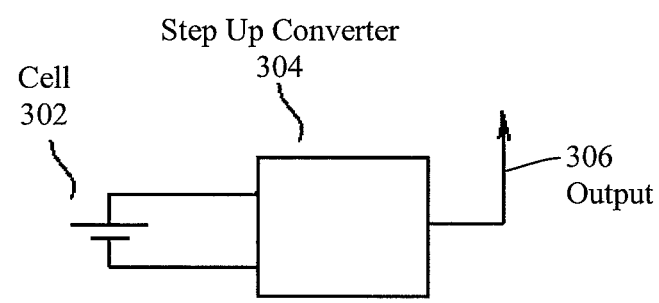
FIG. 3 is a schematic block diagram of an embodiment of a step-up converter.

FIG. 3 is a schematic block diagram illustrating a step-up converter 304. As shown in FIG. 3, a single cell 302 is used to power the step-up converter 304. Step-up converter 304 generates an output voltage that is higher than the voltage of cell 302 at output 306. The operation of the step-up converter is described more fully with respect to FIG. 15.

Figure 4:
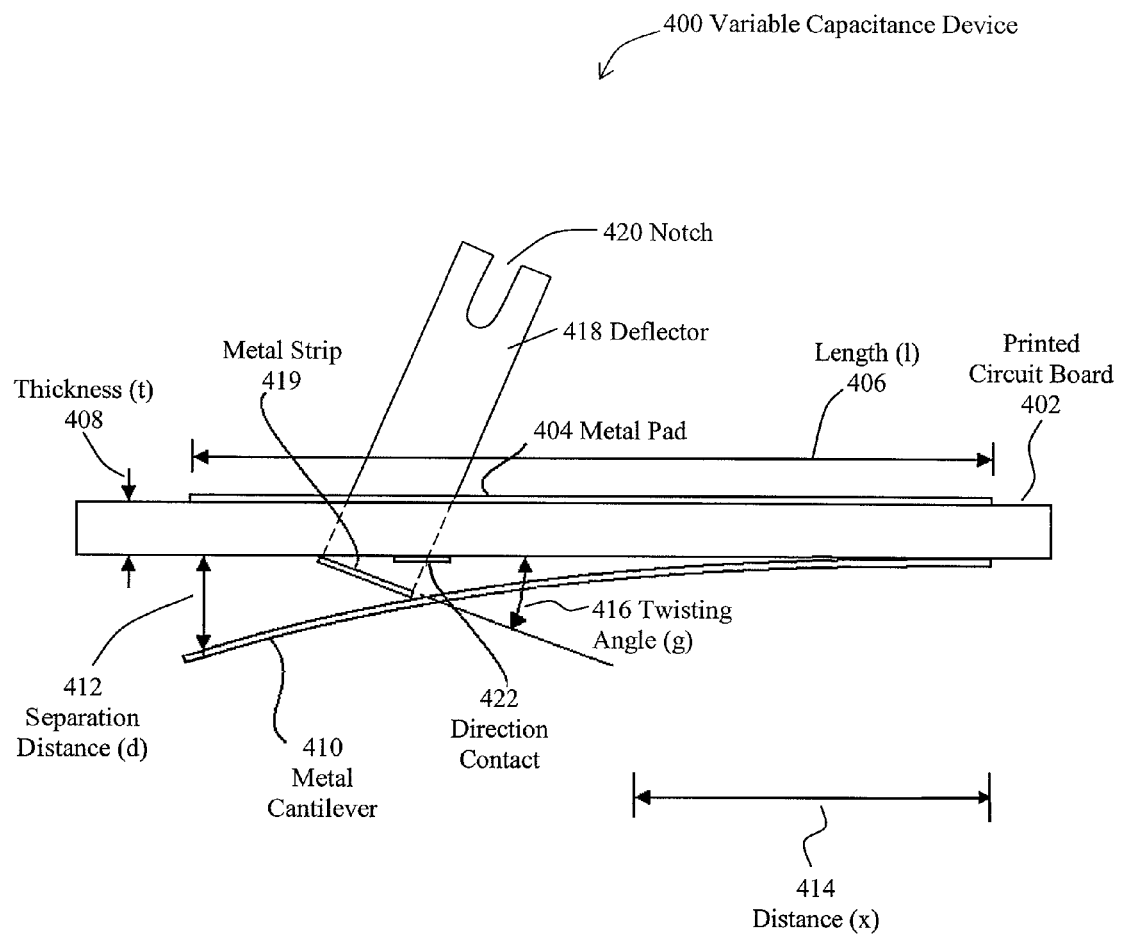
FIG. 4 is a side view of an embodiment of a variable capacitive sensor.

FIG. 4 is a side view of an embodiment of a variable capacitance device 400. As illustrated in FIG. 4, a printed circuit board 402 has a thickness (t) 408 and a dielectric constant (Er). The printed circuit board 402 constitutes the substrate for the variable capacitance device upon which metal pad 404 and metal cantilever 410 are mounted. The capacitance of the variable capacitance device 400 increases if the dielectric constant of the printed circuit board 402 is increased, the thickness 408 is decreased, and the area of the metal pad 402 and metal cantilever 410 are increased. Metal pad 404 is disposed on a top portion of the printed circuit board 402. Metal pad 404 can be a plate that is attached to the printed circuit board 402 or may be an etched portion of the printed circuit board 402, which simplifies the construction and reduces the cost of the variable capacitance device 400.

Metal cantilever 410 is attached on one side of the printed circuit board 402, which allows the metal cantilever 410 to separate from the printed circuit board 402, along the other side of the printed circuit board 402. Deflector 418, which is coupled to joystick 102, is disposed to move in a left/right direction, as illustrated in FIG. 4, which causes the deflector 418 to rock and deflect the metal cantilever 410. A metal strip 419 is disposed on the deflector 418, which contacts the direction contact 422 when tilted to the left, so that the circuitry of the variable capacitance device 400 can identify whether or not the deflector 418 is moved in a forward or reverse direction, or, as shown in FIG. 4, in a left or right direction. The twisting angle (g) 416 is the angle of deflection of deflector 418. Movement of deflector 418 causes metal strip 419 to engage metal cantilever 410, which, in turn, creates a force on the metal cantilever 410, causing the metal cantilever 410 to separate from the printed circuit board 402 by a separation distance (d) 412. The metal cantilever 410 has a sufficient amount of elasticity to create a spring effect, which pushes the deflector 418 toward a neutral position at which the separation distance (d) 412 is essentially zero. A metal strip 419 may be disposed on a bottom portion of the deflector 418 to contact the direction contact 422 to generate a directional signal indicating the direction in which the deflector 418 has been deflected. Notch 420 allows the deflector 418 to move within a post 810 (FIG. 8) so that the deflector 418 can move in a lengthwise direction. Alternatively, the deflector 418 may be formed from a metal, instead of placing a metal strip on the deflector 418 to achieve the same result. Because the metal cantilever 410 is normally planar, any non-zero angle (g) of the end of deflector 418 creates a reaction force in opposition to the bending of the metal cantilever 410. Of course, this is also the case if the deflector 418 is moved to the left, so that the twisting angle (g) is a negative angle. Hence, the metal cantilever 410 creates a reactionary force that pushes the deflector 418 naturally to a neutral position, where the twisting angle (g) is equal to zero and the separation distance (d) 412 is minimal, or substantially zero. When the separation distance (d) 412 is minimum, the capacitive value of the variable capacitance device 400 is greatest, which corresponds to the generation of a zero command. In this manner, the necessity for a trim feature, or factory adjustment, to create a zero command is eliminated. Further, since the control circuitry, disclosed below with respect to FIG. 6A, senses the capacitance of variable capacitance device 400, the use of expensive potentiometers are not needed.

As shown in FIG. 4, the deflector 418 causes the metal cantilever 410 to bend to form a curve. The deflector is mounted toward the left side of the metal cantilever 410, while the right side of the metal cantilever 410 is attached to the printed circuit board 402. Hence, application of forces by the deflector 418 on the left side of the metal cantilever 410 causes the metal cantilever 410 to deflect from the printed circuit board 402 to form a curved shape. In this manner, the change of capacitance of the variable capacitance device 400 occurs less rapidly than the change would occur if the metal cantilever 410 was simply hinged to the printed circuit board 402.

The curved shape of the metal cantilever 410 allows the metal cantilever 410 to be progressively separated from the printed circuit 402. For example, as illustrated in FIG. 4, metal cantilever 410 is separated by a separation distance (d) 412 while metal cantilever 410 may stay substantially close to the printed circuit board 402 over the distance (x) 414. Since air or free space has a much lower dielectric constant, the free space separation between the middle cantilever 410 and the printed circuit board 402 reduces the capacitance of the variable capacitance device 400 in a progressive manner since the metal cantilever has a curved shape. Without the curved deflection of the metal cantilever 410, the capacitance would decreases too rapidly to provide a usable device. For example, if metal cantilever 410 was connected by a hinge to printed circuit 402, deflection of the metal cantilever 410 would cause immediate separation along approximately the entire length of the metal cantilever 410, which would cause the capacitance to drop off very rapidly so a proportional control device using a hinged metal cantilever would not operate properly.

As described above, the capacitance of the variable capacitance device 400 is related to the area of the metal pad 404, the corresponding area of the metal cantilever 410, the separation distance of the metal cantilever 410 and metal pad 404, and the dielectric constants of the printed circuit board 402 and the air disposed between metal cantilever 410 and the printed circuit board 402.

The cantilever shape is approximated by $$D(x) \approx d\frac{3lx^2 - x^3}{2l^3} \quad \text{Equation (1)}$$

Therefore, the capacitance of the mechanism (ignoring fringing fields) is approximately, $$C \approx \int_0^l \varepsilon_0 W \frac{\varepsilon_r}{D(x)\varepsilon_r + t} dx \quad \text{Equation (2)}$$
$$= \int_0^l \varepsilon_0 W \frac{2l^3 \varepsilon_r}{d(3lx^2 - x^3)\varepsilon_r + t} dx$$

Figure 5:
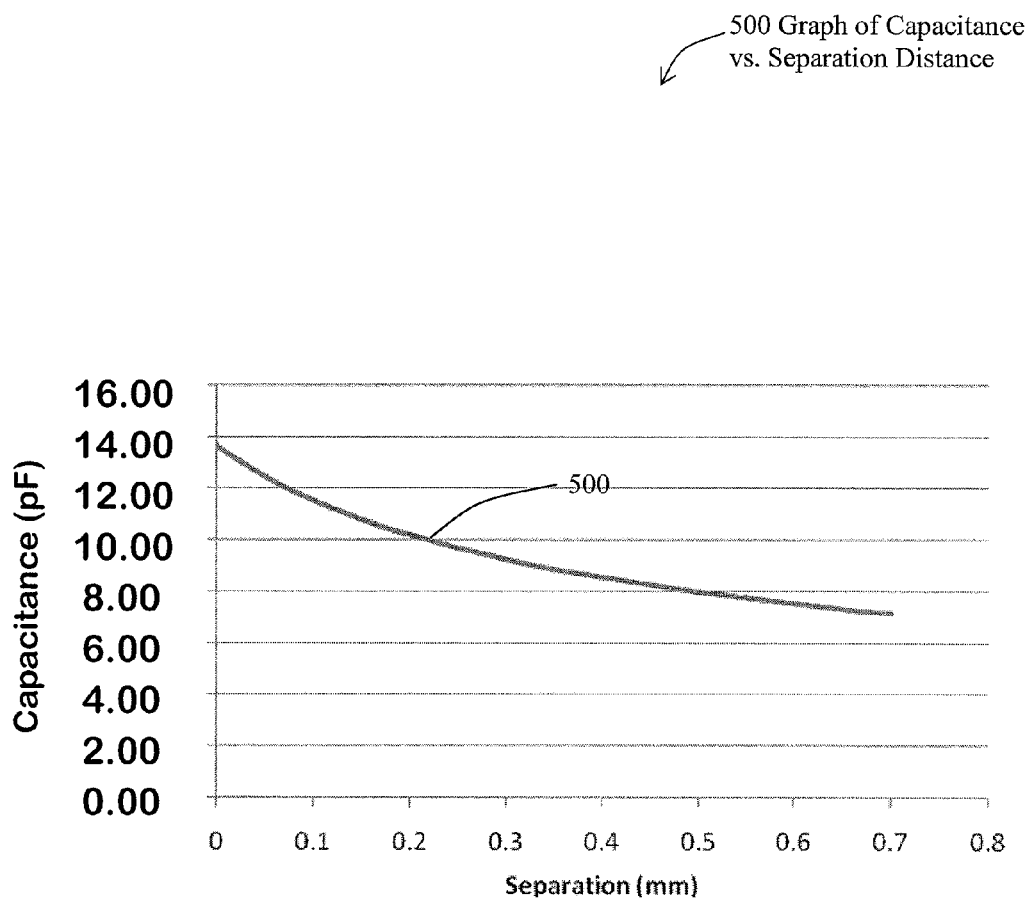
FIG. 5 is a graph of capacitance versus separation distance of the embodiment of the variable capacitive sensor of FIG. 4.

This integral can be numerically integrated to provide the curve of FIG. 5. In the numerical example for the graph of FIG. 4, the values used were l=23 mm
W=12 mm
Er=4.47
t=0.8
d=0 to 0.8 mm The above analysis considers the capacitance as a function of the distance d. In accordance with one embodiment, the distance d is set by $$d \approx a \cdot \sin(g) \quad \text{Equation (3)}$$

where α is the width of the metal strip 419.

FIG. 5 is a graph of the capacitance of the variable capacitance device 400 versus separation distance (d) 412 of the metal cantilever 410 from the printed circuit board 402. As shown in FIG. 4, the capacitance decreases from a maximum value of approximately 14 pF when the separation distance (d) is minimal, which corresponds to the neutral position. This is the case for both negative and positive excursions of the angle (g). The graph 500 indicates a progressive decrease in capacitance from 14 pico-farads to approximately 7 pico-farads as the separation distance (d) moves from a zero separation to approximately 0.7 millimeters. This progressive decrease in capacitance allows the variable capacitance device 400 to be employed as a proportional controller. As disclosed above, direction contact 422 provides the sign of the deflection angle g. In the position shown in FIG. 14, the direction contact 422 is not in electrical contact with metal strip 419. However, when deflector 418 is deflected in the opposite direction to the left (forward), direction contact 422 comes into electrical contact with metal strip 419. The absence or presence of an electrical connection between metal strip 419 and direction contact 422 is then used to determine the sign of the deflection of angle (g).

Figure 6A:
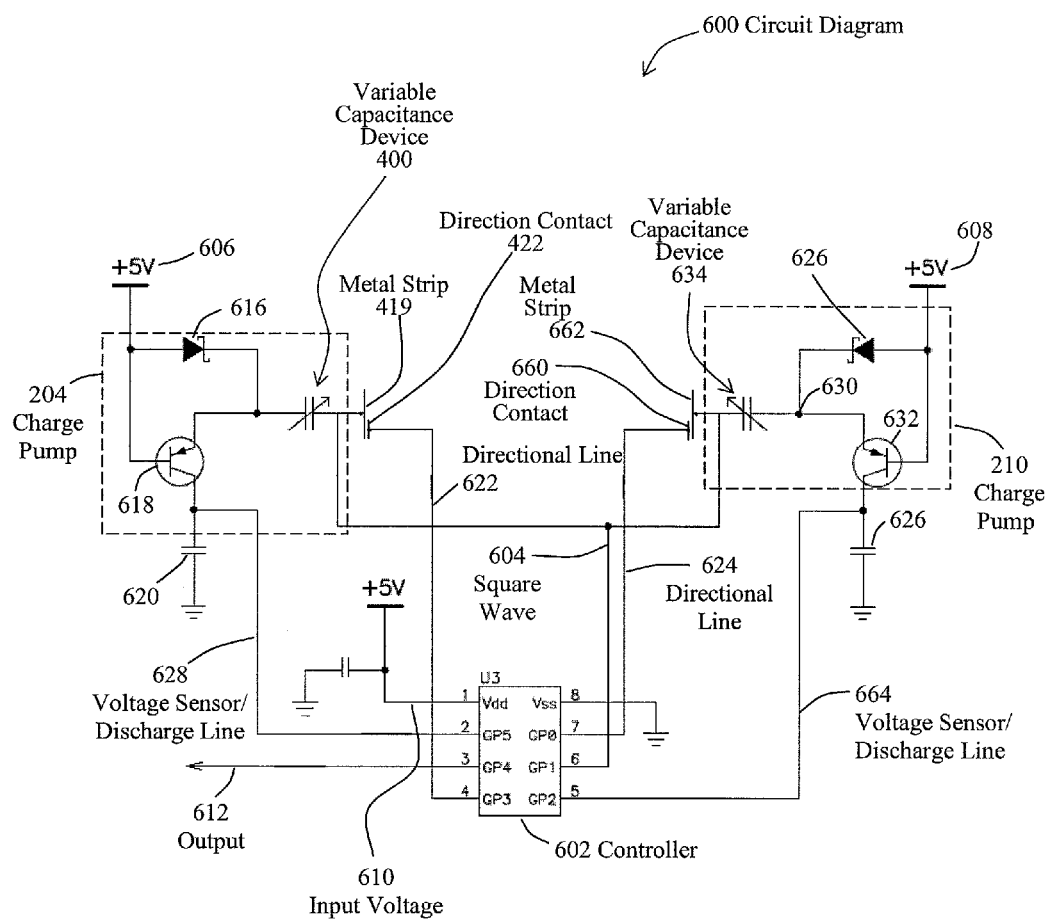
FIG. 6A is a circuit diagram of an embodiment of the proportional remote control of FIG. 1.
Figure 15:
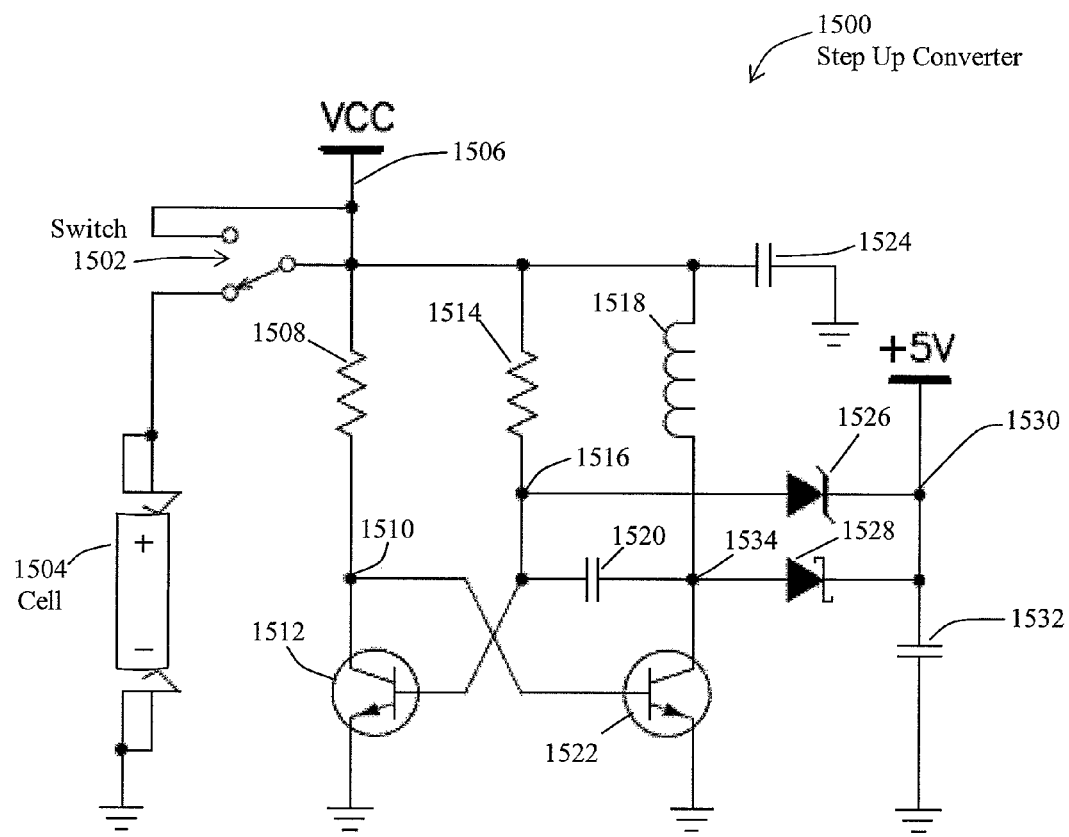
FIG. 15 is an electrical schematic diagram of one embodiment of a step-up converter.

FIG. 6A is a schematic circuit diagram 600 of one embodiment of the circuitry that can be used in remote control 100. As shown in FIG. 6A, the two variable capacitance devices 400, 634 are connected to identical circuitry. Controller 602 is powered by an input voltage 610 of 5 volts on pin 1 from step-up converter 304 (FIG. 3 and FIG. 15). Pin 8 connects the controller 602 to ground. Pin 7 senses contact of the metal strip 662 with the direction contact 660 to indicate, to the controller 602, the direction of deflection of the joystick 104 on directional line 624. Similarly, directional line 622, connected to pin 4 of controller 602, detects contact between the metal strip 419 and direction contact 422 to determine the direction of deflection of deflector 418 (FIG. 4). Variable capacitance device 634 is connected to charge pump 210. Pin 5 of the controller 602 is connected between the charge pump 210 and integrating capacitor 626. Pin 5 discharges integrating capacitor 626 to ground to start the process. Pin 6 generates a pulse signal such as a square wave 644 (FIG. 6B) that is applied to variable capacitance device 634. Similarly, variable capacitance device 400 is connected to charge pump 204. Pin 2 of controller 602 is connected between charge pump 204 and integrating capacitor 620. Pin 2 discharges integrating capacitor 620 to ground then releases integrating capacitor 620 to start the process. The pulse signal, such as square wave 644 (FIG. 6B) is applied to variable capacitance device 400. Variable capacitance device 400 has a variable capacitance based upon the deflection of the deflector 418, as described above. Each time a high-to-low transition occurs in the square wave 604 that is applied to the variable capacitance device 400, the variable capacitance device 400 is charged through diode 616. Each time a low-to-high transition occurs in the square wave 604, the capacitance charge on the variable capacitance device 400 flows onto the emitter of transistor 616. The charge from the variable capacitance device 400 passes through transistor 618 into capacitor 620 through the collector of transistor 618. Eventually, with a sufficient number of high-to-low and low-to-high transitions, the voltage on capacitor 620 reaches a threshold, which is detected by pin 2 of controller 602. Controller 602 registers the voltage as a high value. Pin 2 of controller 602 then discharges capacitor 626 to a zero voltage via voltage sensor/discharge line 628. A counter within the controller 602 counts the number of square wave transitions that charge the integrating capacitor 620 to the threshold level. The number of square wave transitions indicates the capacitance of the variable capacitance device 422, which functions to accumulate the charge provided by the square wave 604 and transfers that charge to integrating capacitor 620. Hence, the number of counts of transitions is directly related to the capacitance of the variable capacitance device 422, which in turn, is directly related to the position of deflector 418 (FIG. 4).

The same process occurs with respect to variable capacitance device 634. The square wave signal 604 is applied to the charge pump 210, which comprises the variable capacitance device 634, diode 626 and transistor 632. Metal strip 662 and direction contact 660 provide directional information on direction line 624 for the controller 602. Pin 5 of the controller 602 is connected to voltage sensor/discharge line 664 that is connected between the capacitor 626 and transistor 632. When the process begins, the capacitor 626 is discharged by voltage sensor/discharge line 664. Charge from the variable capacitance device 634 is transferred to integrating capacitor 626 until the voltage on capacitor 626, as sensed by voltage sensor line 664 reaches a threshold value. Controller 602 detects the threshold value, counts the number of pulses required to reach the threshold value and then discharges capacitor 626 via voltage sensor/discharge line 664, and the process can begin again. The number of counts is supplied to output 612, which is an indication of the position of the joystick 104 that is connected to variable capacitance device 634.

Figure 6B:
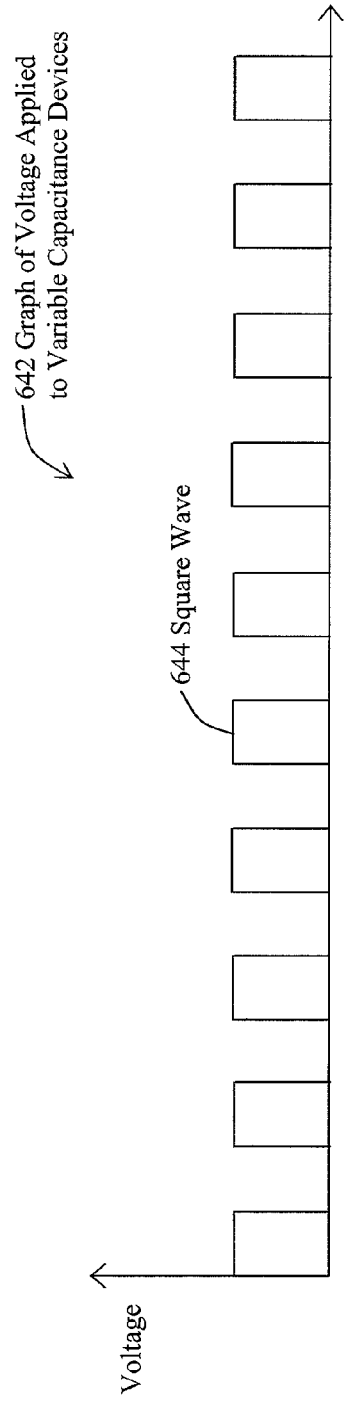
FIG. 6B is a graph of an example of a periodic charge voltage that is applied to the variable capacitance devices.

FIG. 6B is a graph 642 of one embodiment of voltages that it can be applied to the variable capacitance devices. As shown in FIG. 6B, the square wave 644 are generated by the controller 602. The square wave output 604 from pin 6 is applied to charge pump 210 and charge pump 204.

Figure 6C:
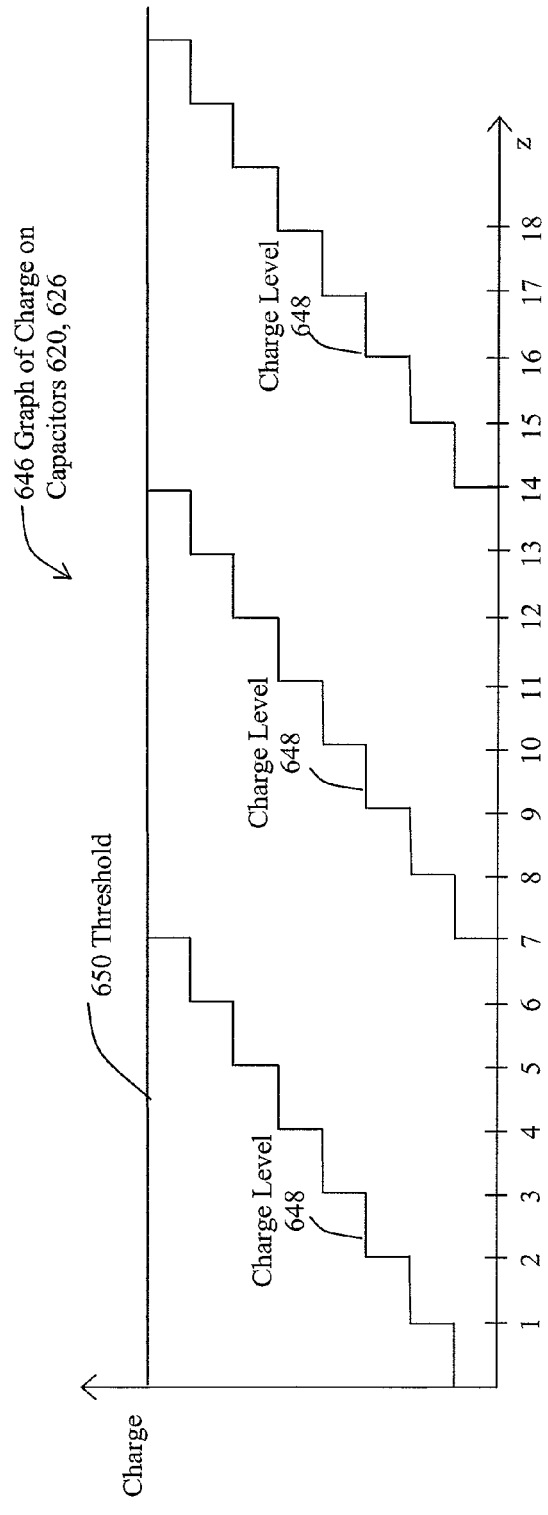
FIG. 6C is a graph of the charge levels accumulated by the charge pump capacitors.

FIG. 6C is a graph 646 of charges accumulated on integrating capacitors 620, 626. As illustrated in FIG. 6C, the charge levels increase on the capacitor 620, 626 until they reach a threshold level 650. At that point, discharge signals are generated on pins 2 and 5 to discharge the capacitors 620, 626, respectively. Controller 602 counts the number of pulses that are required to reach the threshold level 650. The number of pulses is related to the position of the joysticks 102, 104, which change the capacitance of variable capacitance devices 400, 634.

Since the capacitance on the variable capacitance devices 400, 634 are inversely proportional to the separation distance (d) 412 (FIG. 4), and since the number of cycles required to charge the variable capacitance devices 400, 634 (FIG. 6A) to a predetermined voltage level is proportional to the inverse of the capacitance of the variable capacitance devices 400, 634, the number of cycles required to charge capacitors 620, 626 to a predetermined voltage level is approximately linearly proportional to the separation distance (d) 412. Since the separation distance (d) 412 is approximately equal to the twisting angle (g) 416, which is the angle of the joysticks 102, 104, the joystick angle can be measured to be approximately proportional to the number of pulses required to reach the threshold 650.

Figure 7:
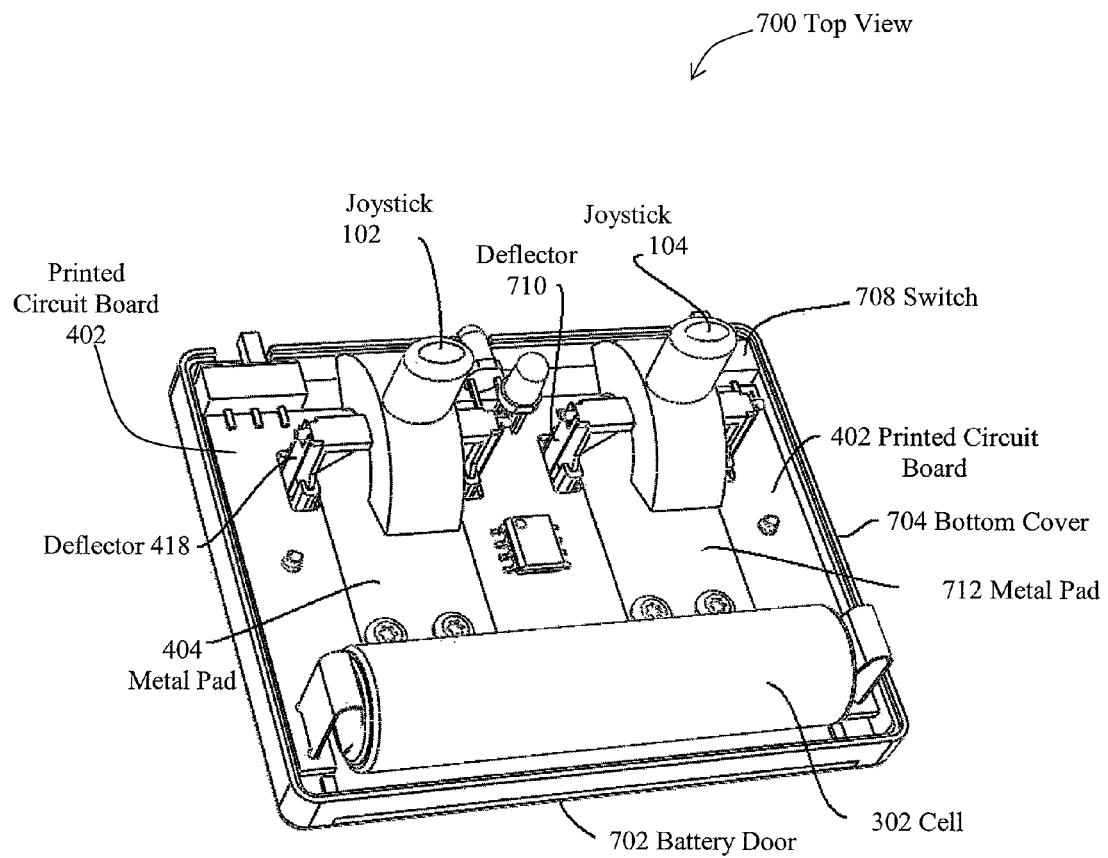
FIG. 7 is a perspective top view of the proportional remote control of the embodiment of FIG. 1, with the top cover removed.

FIG. 7 is a top view of the remote controller 100 with the top cover removed. The embodiment of FIG. 7 corresponds to the embodiment of FIG. 1 in which there are two joysticks 102, 104. Any number of joysticks can be used in the remote controller device 100. FIG. 7 also illustrates a battery door 702, a bottom cover 704, cell 302, switch 708, and metal pads 404, 712. FIG. 7 also illustrates the printed circuit board 402 and deflectors 418, 710.

Figure 8:
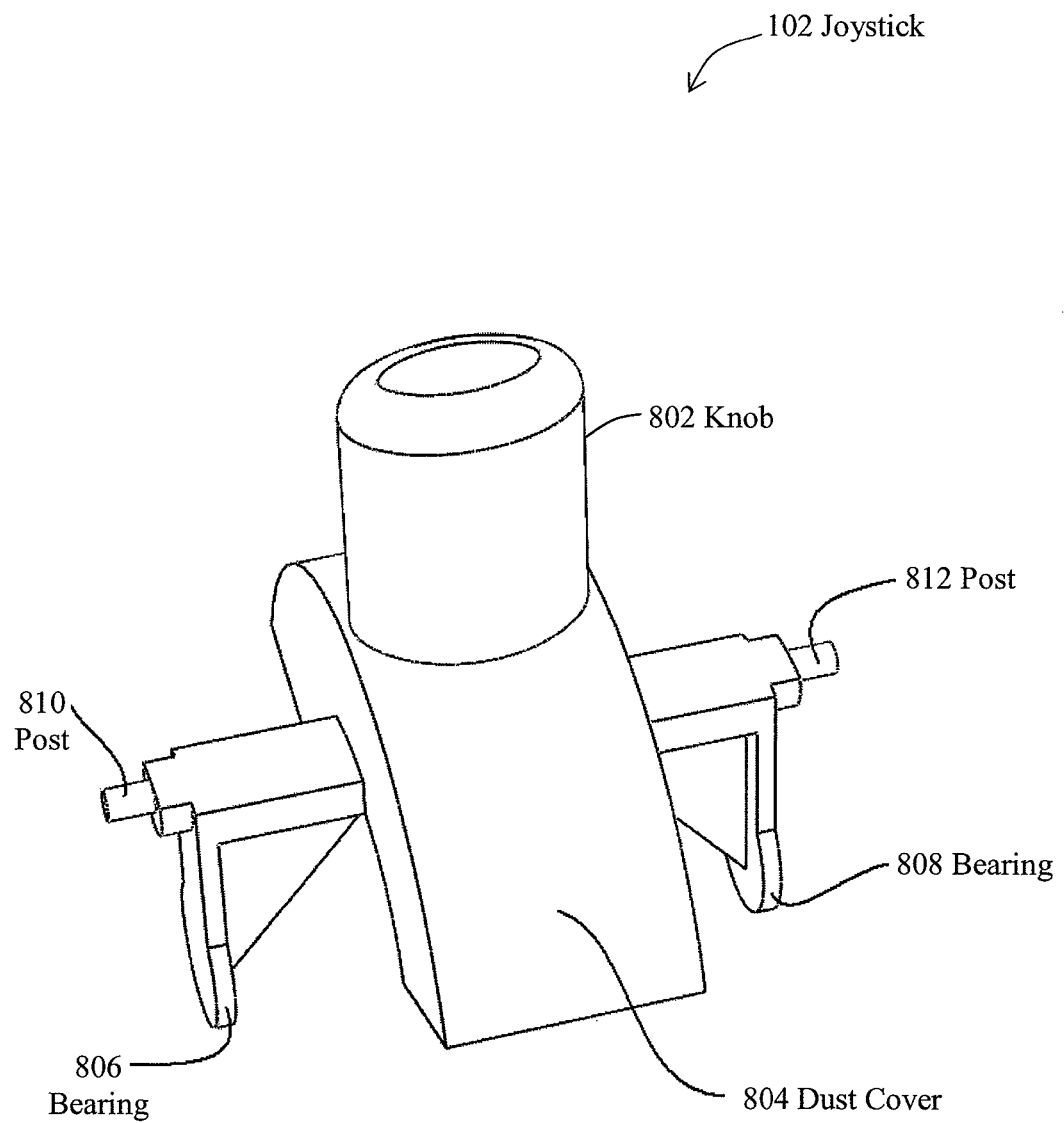
FIG. 8 is a perspective view of an embodiment of a joystick.

FIG. 8 is a perspective view of one embodiment of a joystick 102. As shown in FIG. 8, the joystick 102 has a knob 802 that can be easily gripped by the operator. The knob 802 is connected to a dust cover 804 that keeps the enclosure sealed regardless of the position of the joystick in the housing of the remote control device 100. The joystick 102 rotates on bearings 806, 808. These round bearings 806, 808 fit into support structures 1002, which allow the joystick to move in the direction of the bearings 806, 808. Posts 810, 812 engage the notch 420 (FIG. 4) and notch 1102 of the deflector 418, and cause the deflector to twist to produce a twisting angle (g) 416, as illustrated in FIG. 4.

Figure 9:
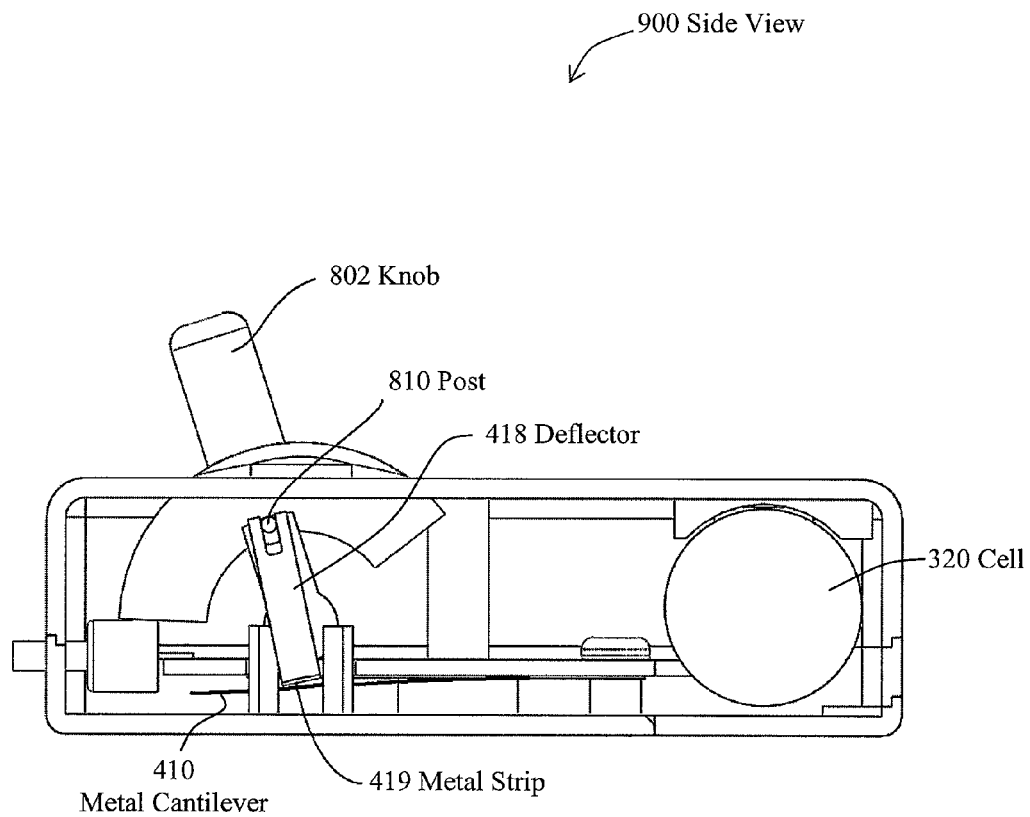
FIG. 9 is a cross-sectional view of the embodiment of the proportional remote control of FIG. 1.

FIG. 9 is a side view 900 of the embodiment of the remote control 100 disclosed in FIG. 1. As illustrated in FIG. 9, the knob 802 is deflected forward. Post 810 fits within the notch 420 (FIG. 11) in the deflector 418. Post 810 causes the deflector 418 to twist in a forward direction, which causes the metal strip 419 to push against the metal cantilever 410 and cause the metal cantilever 410 to deflect downwardly. Cell 320 is also illustrated in FIG. 9.

Figure 10:
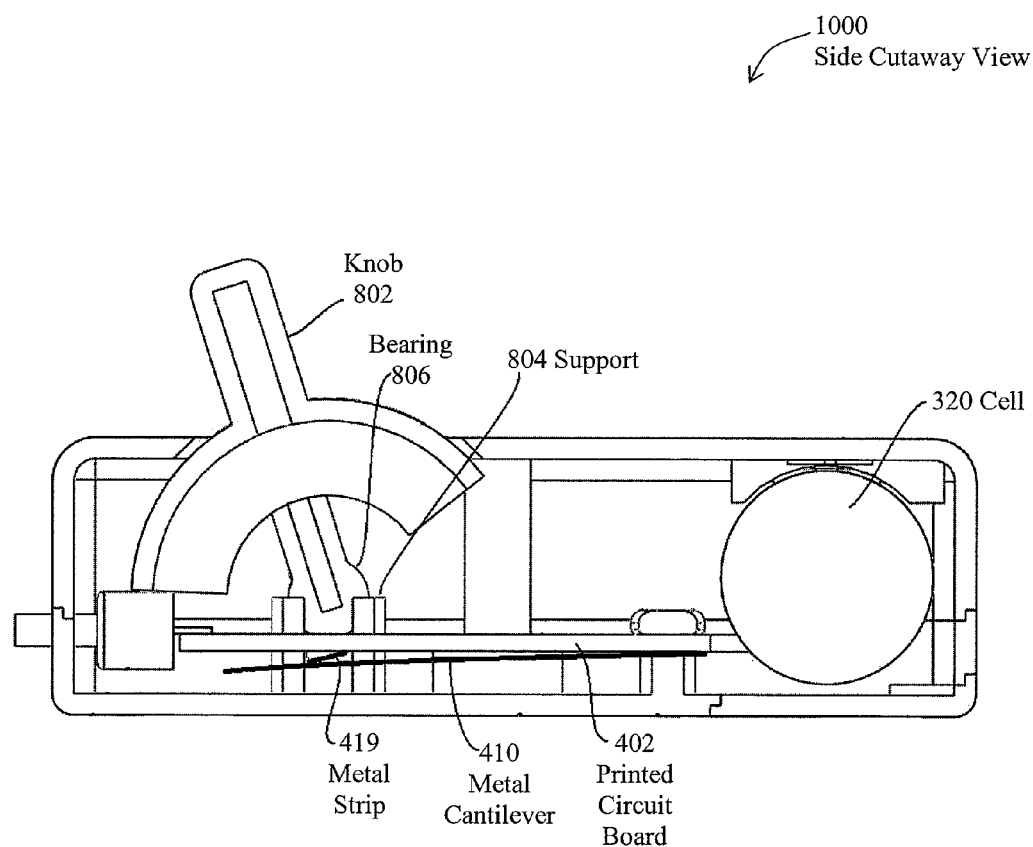
FIG. 10 is a cross-sectional view of the embodiment of the proportional remote control of FIG. 1.

FIG. 10 is a side cutaway view 1000 of the embodiment of a remote controller 100, illustrated in FIG. 1. As shown in FIG. 10, bearing 806 sits within the support 804 and rotates in response to pressure placed on knob 802. FIG. 10 also illustrates the metal strip 419, which is shown as deflecting the metal cantilever 410 that is attached to the printed circuit board 402. Cell 320 is also illustrated in FIG. 10.

Figure 11:
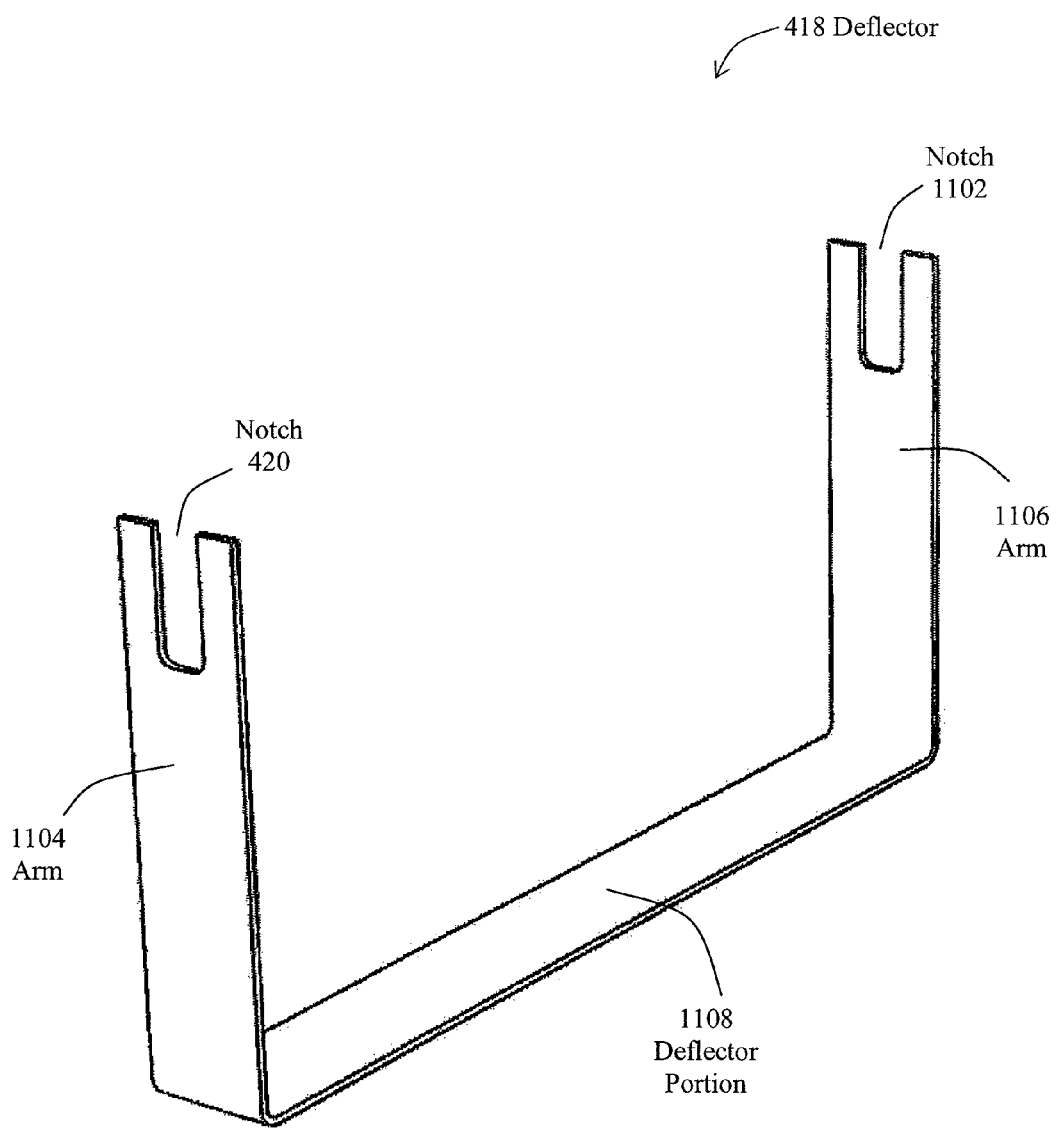
FIG. 11 is a perspective view of an embodiment of a deflector.

FIG. 11 is a perspective view of an embodiment of a deflector 418. As shown in FIG. 11, the deflector 418 has a U-shape with two arms 1104, 1106. Notch 420 is formed in arm 1104 while notch 1102 is formed in arm 1106. Deflector portion 1108 connects the arms 1104, 1106.

Figure 12:
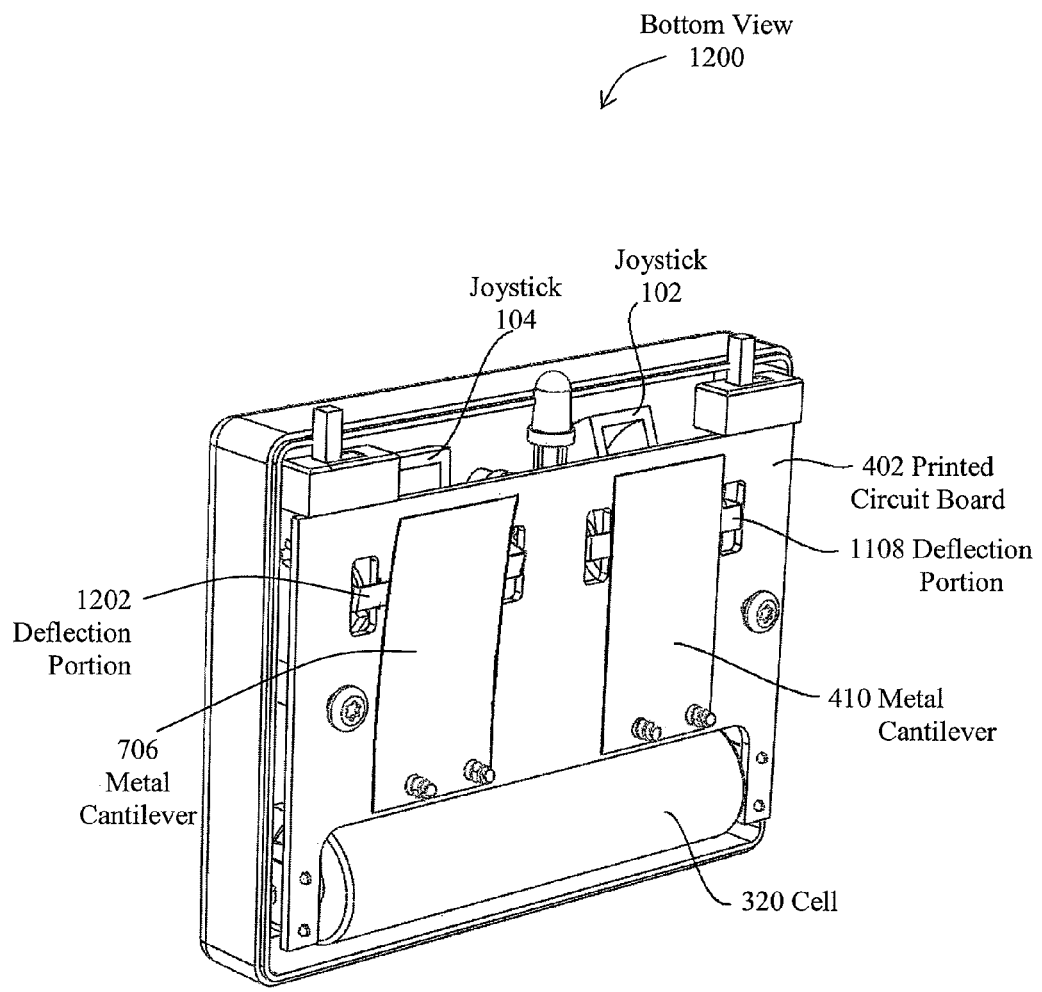
FIG. 12 is a bottom view of an embodiment of the proportional remote control with the bottom cover removed.

FIG. 12 is a bottom view 1200 of the embodiment of the remote controller 100 illustrated in FIG. 1 with the bottom cover removed. As illustrated in FIG. 12, metal cantilevers 410, 706 are attached to the printed circuit board 402. The deflection portions 1108, 1202 of the deflectors are shown as being engaged by the metal cantilevers 410, 706. Bottom portions of joysticks 102, 104 are also illustrated in FIG. 12.

Figure 13:
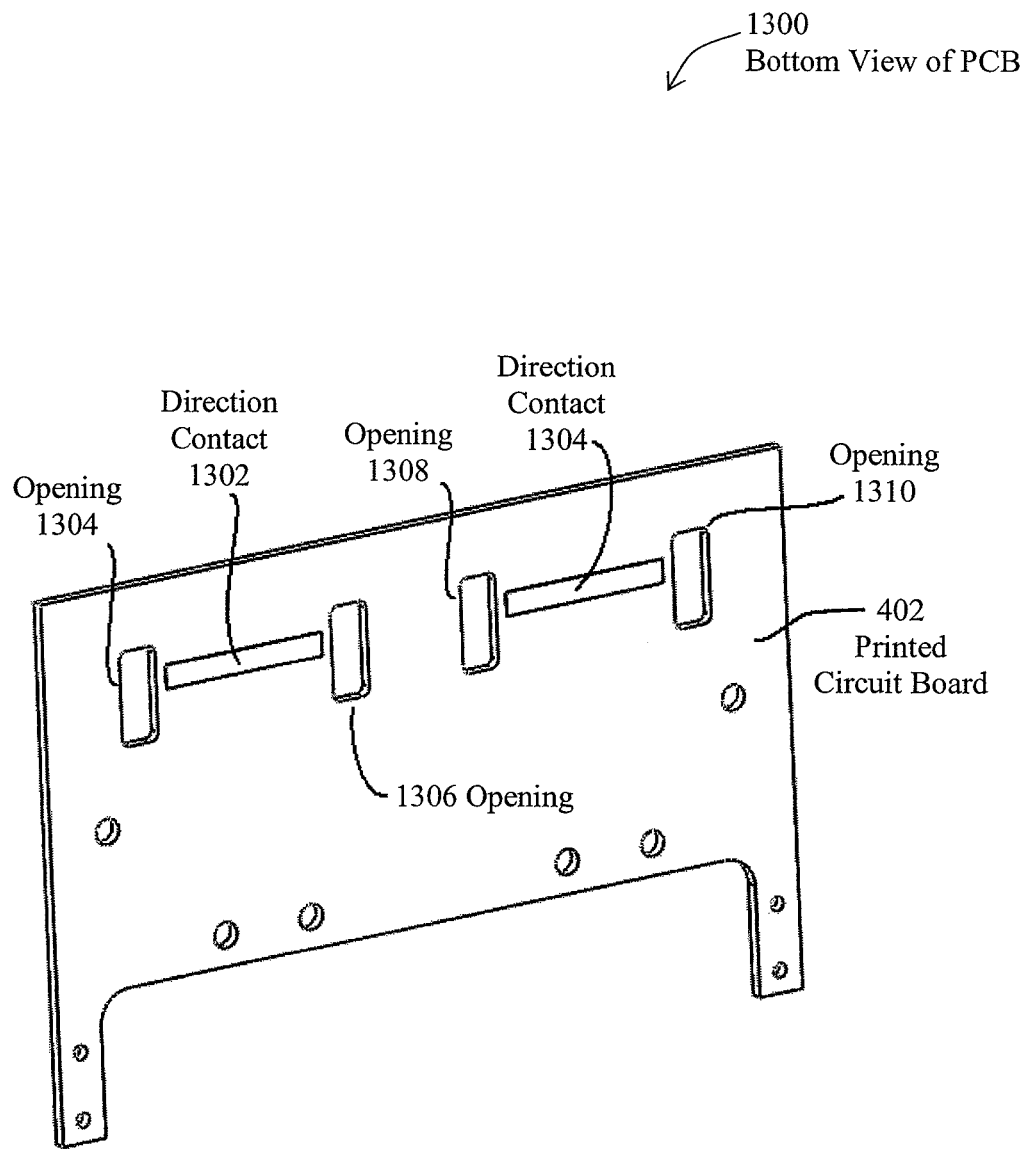
FIG. 13 is a perspective view of the bottom portion of the printed circuit board of the embodiment of FIG. 1.

FIG. 13 is a bottom view 1300 of one embodiment of the printed circuit board 402. Openings 1304, 1306, 1308, 1310 provide passage for the supports such as support 804 (FIG. 10). Directional contacts 1302, 1304 are engaged by the bottom portion of the deflectors, such as deflector portions 1108, 1202, respectively.

Figure 14:
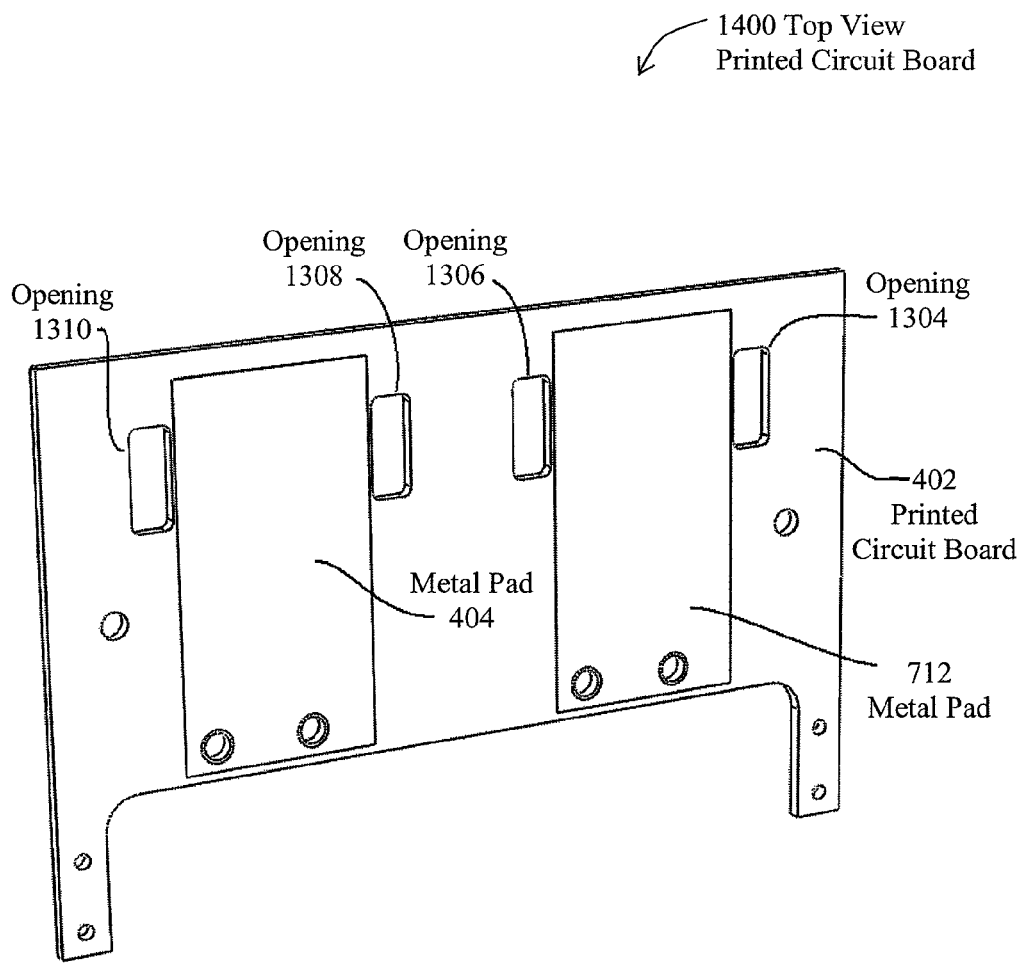
FIG. 14 is a perspective view of the bottom portion of the printed circuit board of the embodiment of FIG. 1.

FIG. 14 is a top view 1400 of the printed circuit board. Metal pads 404, 712 are illustrated which are formed onto the printed circuit board 402. Openings 1304, 1306, 1308, 1310 are also illustrated in FIG. 14.

Remote control devices are typically powered by batteries. In certain applications, it may be desirable, for reasons of size and other reasons, to operate a remote control device from a single battery, such as an alkaline cell. An alkaline cell delivers 1.6 volts when fully charged and this decreases to approximately 0.8 volts at the end of the lifetime of the battery. Most electronic circuits require higher voltages, such as 3.3 volts or 5 volts, for operation. Hence, the use of multiple cells is usually required. The cost of step-up converters to operate on fewer cells is normally too great. Hence, more cells are utilized and the size of the remote controller must be greater.

FIG. 15 is a schematic circuit diagram of a step-up converter 1500. The step-up converter 1500 can be utilized in the remote controller 100, or other battery power devices, to operate the controller 602 (FIG. 6A), LED drive circuit 2000, and charge pumps 204, 210 (FIG. 6A). The remote controller device 100 is designed to operate the low power, higher-voltage portions of the remote control 100 from a single cell 1504, such as a AAA alkaline cell. Transistors 1512, 1522 forms a bi-stable oscillator. When the circuit is started, capacitors 1520, 1532 are not charged and have zero volts across their leads. When power is applied at VCC 1506 or by cell 1504, using switch 1502, the current flows through resistor 1514. The current flowing through resistor 1514 does not flow through the base of the transistor 1512 since the voltage on capacitor 1520, capacitor 1532 and diode 1528 is less than the turn-on threshold for the base of transistor 1512. Consequently, current flows through resistor 1508 to node 1510 and into the base of transistor 1522. This holds the collector of transistor 1512 low and further prevents current from falling into the base of transistor 1512. When the collector of transistor 1522 is low, current begins to linearly increase in inductor 1518. After a certain period of time, the voltage across capacitor 1520 increases so that the voltage on the base of transistor 1512 is sufficient to cause the base current of transistor 1512 to flow. When sufficient base current of transistor 1512 flows from the resistor 1514 into the base of transistor 1512, transistor 1512 turns-on and brings the collector voltage at node 1510 low. When the voltage at node 1510 is low, current does not flow through the base of transistor 1522 and transistor 1522 turns-off and the collector to emitter current of transistor 1522 goes to zero. Resistor 1514 and capacitor 1520 provide a RC time constant that defines the amount of time that transistor 1522 is turned on. This time is approximately proportional to the peak current in the inductor 1518 since on each cycle, the inductor starts with nearly zero current.

Prior to the collector of transistor 1522 turning off, the current in inductor 1518 rises to a substantial value. When the collector of transistor 1522 turns off, inductor 1518 causes the voltage at node 1534 to rise until diode 1528 begins to conduct. At this point, all of the current from inductor 1518 passes through diode 1528 into the output capacitor 1532. The current flowing through capacitor 1532 causes the voltage to rise on capacitor 1532. During this interval, the current in the inductor 1518 decreases, while the voltage at node 1534 maintains a value, which is one diode drop above the output voltage of capacitor 1532.

In accordance with the embodiment of FIG. 15, when the stored energy in inductor 1518 has been fully transferred to the output capacitor 1532, the voltage at node 1534 goes low. This transition couples through capacitor 1520 and tends to turn off transistor 1512. When transistor 1512 turns off, this in turn causes transistor 1522 to turn on, further pulling the voltage at node 1534 low. This transient positive feedback tends to drive the transistors 1512, 1522 through the transition region quickly. This cycle then repeats indefinitely.

Zener diode 1526 of FIG. 15 provides a limiting function to regulate the output voltage on output capacitor 1532. In normal operation, the voltage at the base of transistor 1512 goes negative when transistor 1522 turns on. Resistor 1514 charges the capacitor 1520 during this interval and the voltage at the base of transistor 1512 rises until the base of transistor 1512 conducts. However, when the output voltage of capacitor 1532 gets sufficiently high, zener diode 1526 limits the negative excursion of the signal at the base of transistor 1512 at node 1516. As the output voltage on capacitor 1532 rises further, the negative excursion is further limited. When the negative excursion is limited, the amount of time is reduced that transistor 1522 is turned on. This process has the effect of lowering the drive to the output capacitor 1532. Therefore, zener diode 1526 acts as a voltage limiting element to keep the output voltage regulated to a predetermined voltage.

Resistor 1514 of FIG. 15 connects to the input voltage so that when the input voltage from cell 1504 drops, the on-time of transistor 1522 increases. This process helps the step-up converter circuit 1500 to maintain a constant output voltage despite a range of possible input voltages resulting from the cell 1504 discharging. The step-up converter 1500 utilizes inexpensive parts to create an economical voltage step-up. The step-up converter 1500 utilizes a single cell 1504, has two resistors, two transistors, three capacitors, one inductor and two diodes. Transistors 1512, 1522 can be purchased in a dual package, which costs about 1 cent in high volumes. The circuit also functions well over a wide range of voltages of the cell 1504. For example, step-up converter 1500 can operate with voltages as low as 0.8 volts on cell 1504 and can produce the 5-volt output as a result of the energy that is stored in the inductor 1518.

Figure 16:
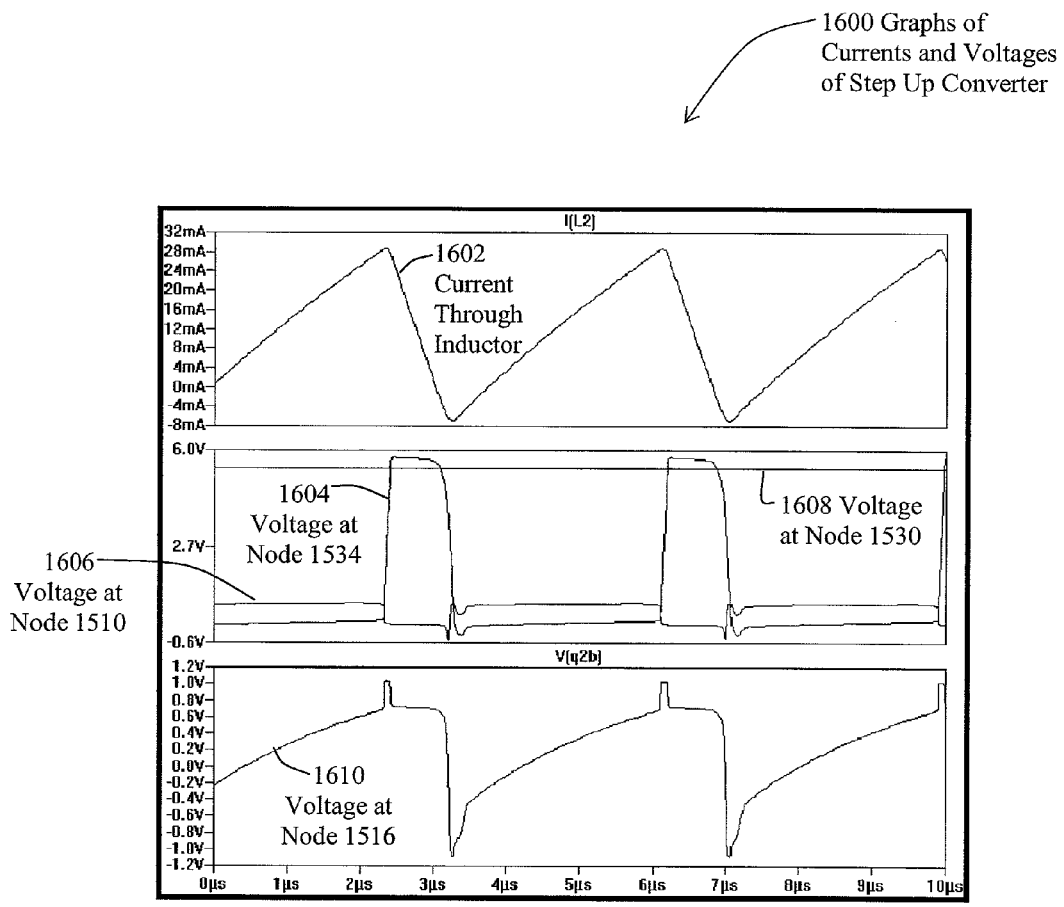
FIG. 16 is a set of graphs of the currents and voltages produced at various portions of the step-up converter of the embodiment of FIG. 15.

FIG. 16 is a series of graphs 1600 of the currents and voltages of the step-up converter 1500 illustrated in FIG. 15. As shown in FIG. 16, plot 1602 illustrates the current through the inductor 1518. Plot 1606 shows the voltages at node 1510. Plot 1604 illustrates the voltages at node 1534. Plot 1608 illustrates the voltages at node 1530.

Figure 17:
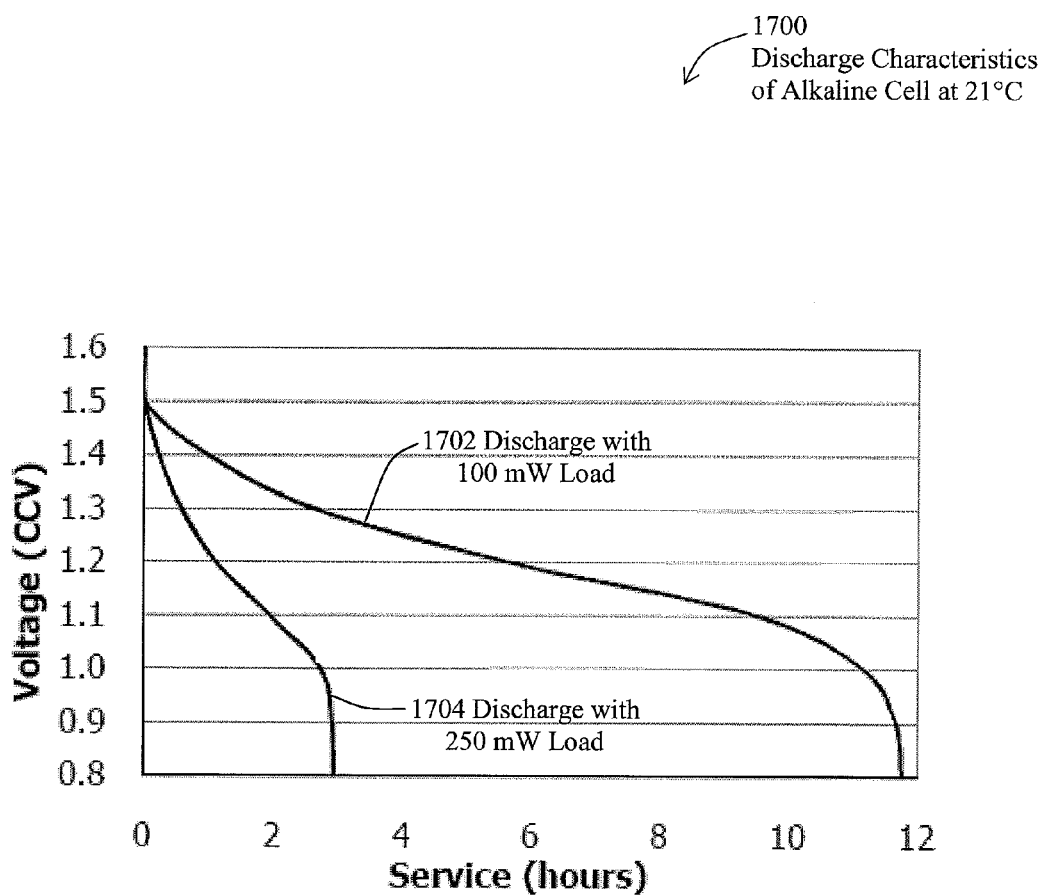
FIG. 17 is a graph of the discharge characteristics of a typical AAA alkaline cell, with two different constant-power loads.

FIG. 17 is a graph 1700 that illustrates the discharge characteristics of an alkaline cell at 21° C. for different constant-power loads. As shown in FIG. 17, plot 1702 illustrates the discharge characteristics of an alkaline cell with a 100 mW load. Plot 1704 illustrates the discharge characteristics of an alkaline cell with a 250 mW load. As is indicated by the plots in FIG. 17, the cell voltage drops off very quickly once the cell is discharged to about 1 volt. As such, the step-up converter 1500 can provide an output charge of 5 volts with voltage levels on the single alkaline cell dropping to as low as 0.8 volts. Although the step-up converter 1500 illustrated in FIG. 1 is well suited for applications with a single alkaline cell, the circuit can be modified for use with multiple cells and can be used in multiple different applications with virtually any portable electronic circuit that uses batteries.

Remote controllers use a variety of ways to transmit information to a remotely controlled device. In one embodiment, modulated infrared light can be transmitted from the remote controller to the remotely controlled device. The remotely controlled device receives and demodulates the optical signal. These techniques are often used in high volume consumer, industrial and medical products that are battery operated. The infrared LEDs of these devices are driven with an amplitude modulated square wave at about 38 kH. On/off keying is used to modulate the 38 kH carrier. Receivers for receiving the amplitude modulated signals are readily available. The receivers consist of an infrared detector, a gain stage, a band pass filter and a detector to reconstruct the original modulated data.

Typical transmitters that transmit the modulated data consist of circuits that drive the infrared LEDs with a square wave having a duty cycle of approximately 50 percent. A resistor is used to limit the current that can be applied to the infrared LED to protect the infrared LED. In cases where the battery voltage is too low to drive the LED directly, a step-up converter is used to generate a higher voltage to drive the LED. These devices are inefficient, since the drive current also flows through the limiting resistor. For example, in a case where the supply voltage is 5 volts, the power lost in the resistor is 2.8 times the power delivered to the infrared LED. In addition, when the power source supplies a low voltage, the step-up converter is required, which further adds to the inefficiencies of the design. Although infrared LEDs have a forward voltage of about 1.3 volts, a single cell is capable of directly driving an infrared LED in a very efficient manner. However, directly driving an infrared LED is highly dependent upon the charge of the cell, which is easily discharged to below 1.3 volts. In that manner, the full life of the cell, which extends to approximately 0.8 volts, is not utilized.

Figure 18:
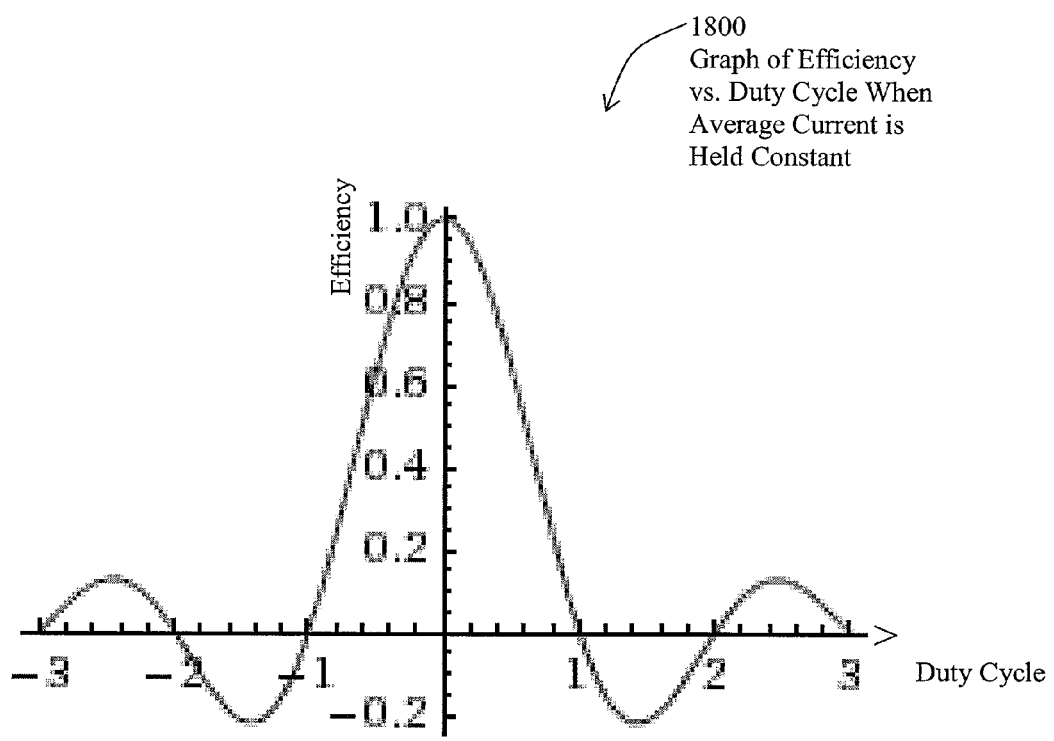
FIG. 18 is a graph of efficiency versus duty cycle for an LED drive circuit when average current is held constant.

FIG. 18 is a graph 1800 illustrating the efficiency of a drive circuit for a LED versus duty cycle of the signal that is applied to the drive circuit assuming the average current through the LED is held constant. As shown in FIG. 18, the efficiency goes up greatly when the duty cycle for a given average current is reduced. The graph 1800 indicates that very short pulses with a low duty cycle provide the highest efficiency for any given average current.

Figure 19:
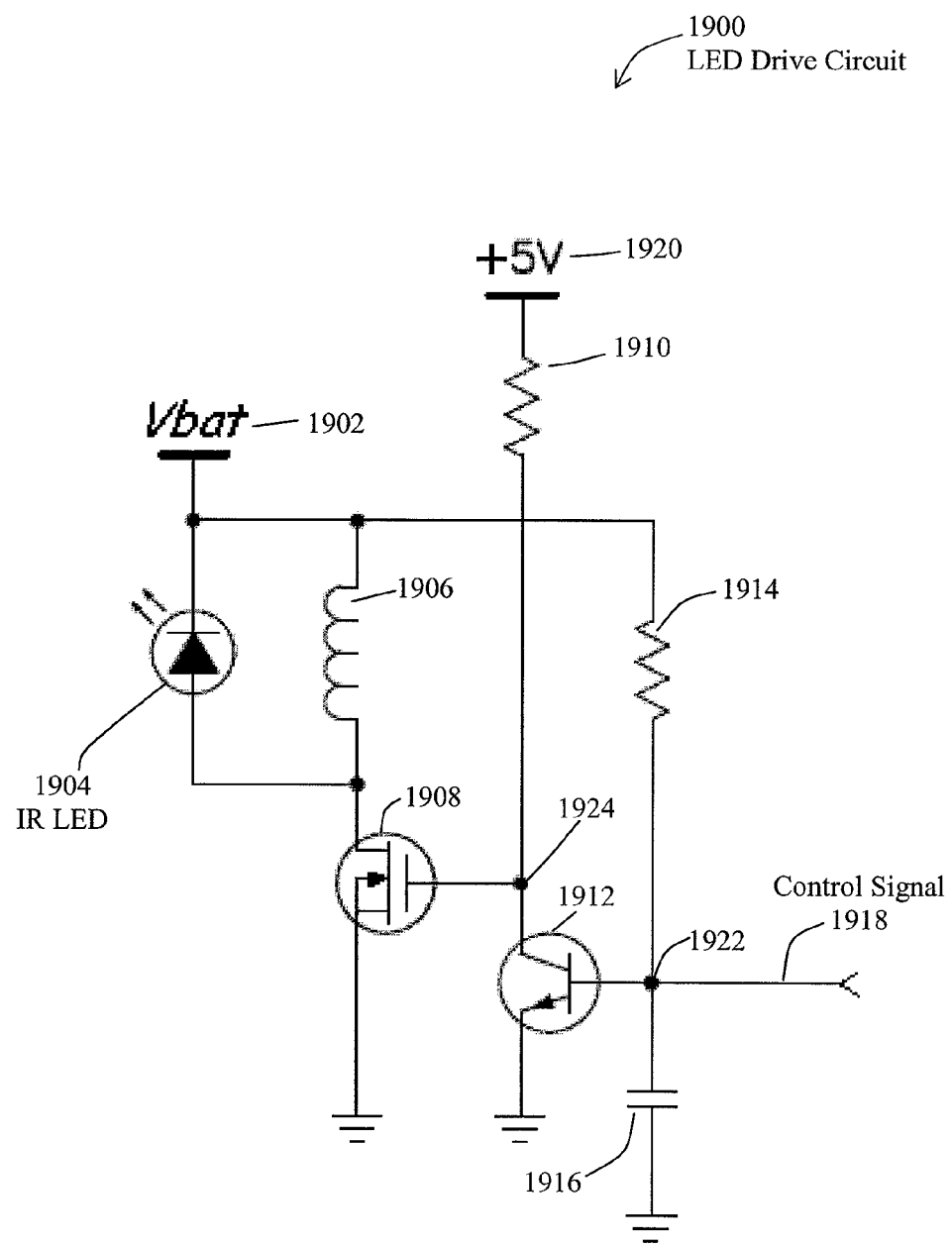
FIG. 19 is a schematic circuit diagram of one embodiment of an LED drive circuit.

FIG. 19 is a schematic circuit diagram of an embodiment of a LED drive circuit 1900. The average infrared LED current ($I_{avg}$) is given by:

$$I_{avg} = I_{pk} D \Rightarrow I_{pk} = \frac{I_{avg}}{D} \qquad \text{Equation (4)}$$

The rate that photons are emitted by infrared LEDs is approximately proportional to the drive current through the infrared LED. The rate that electrons are liberated by incoming infrared photons in a photodiode detector is approximately proportional to the rate of the incoming photons.

Therefore, providing current to an infrared LED and detecting the current from a photodiode is approximately linear. In other words, doubling the infrared LED current approximately doubles the detected photodiode current with other parameters held constant.

With this assumption, optimizing the amplitude of the drive current at the modulation frequency for a given amount of average drive current improves efficiency. Since a band pass filter tuned to the modulation frequency is used on the receiving end, currents received at out of bound frequencies do not contribute to the detected signal.

Assuming that the drive current is applied as a square wave with a duty cycle D, amplitude A, and a period T, a Fourier analysis indicates that the amplitude $a_n$ of the $n^{th}$ harmonic is given as:

$$a_n = 2I_{pk}D\frac{\sin(n\pi D)}{(n\pi D)} \quad \text{Equation (5)}$$

Substituting Equation _____ for the average current into Equation _____ gives $$a_n = 2\frac{I_{avg}}{D}D\frac{\sin(n\pi D)}{(n\pi D)} \quad \text{Equation (6)}$$
$$= 2I_{avg}\frac{\sin(n\pi D)}{(n\pi D)}$$
$$= 2I_{avg}Sa(n\pi D)$$

For the fundamental (n=1), then $$a_1 = 2I_{avg}Sa(\pi D) \quad \text{Equation (7)}$$

The function of Equation 7 is the curve illustrated in the graph 1800 of FIG. 18. As indicated above, the most efficient use of a given amount of average current occurs when the duty cycle D is nearly zero. When the duty cycle is around 50 percent, as is common in prior art LED driver circuits, the system operates with an efficiency factor of about 64 percent relative to the optimal efficiency. Hence, much lower duty cycles with much higher peak currents greatly increase the efficiency factor.

In that regard, the LED drive circuit 1900 of FIG. 1900 is designed to create a narrower pulse with a higher peak current, as compared to a lower peak current with a wider drive pulse. Control signal 1918 may be provided from a micro controller or dedicated modulator integrated circuit. Control signal 1918 periodically discharges the capacitor 1916. For standard infrared controllers, the modulation rate is 38 kHz. The duration of the discharge pulse is much shorter than the other time constants in the LED drive circuit 1900. After the discharge pulses are removed, capacitor 1916 charges with current flowing through resistor 1914. For a fixed period of time, the voltage on capacitor 1916 begins to rise to the turn-on threshold voltage of transistor 1912. During this interval, the base of the transistor 1912 is not driven, but rather, the current through the resistor 1914 simply flows through capacitor 1916 until capacitor 1916 is charged to the threshold voltage. The collector voltage of transistor 1912, at node 1924, rises to 5 volts, which turns-on FET 1908. Once FET 1908 is turned on, current increases linearly through inductor 1906. The time that the current in inductor 1906 increases linearly is determined by the resistance of resistor 1914 and the capacitance of capacitor 1916 as well as the supply voltage $V_{bat}$ 1902. When the voltage across capacitor 1916 increases to the turn-on threshold voltage of transistor 1912, transistor 1912 turns-on and causes the FET 1908 to turn off. When FET 1908 turns off, the current in inductor 1906 discharges through the infrared LED 1904 in the form of a high voltage pulse. The amount of time that the current passes through the infrared LED 1904 is determined by the voltage drop across the infrared LED 1904, the value of the inductor 1906, and the peak current produced by inductor 1906 at the time the FET 1908 is turned off. However, only low current is required to be supplied by the 5 volt supply 1920 through resistor 1910. The larger currents required to drive the infrared LED 1904 are supplied directly from the battery powered 1902.

Resistor 1914, FIG. 19, is connected to the battery voltage 1902 to affect an inherent regulation characteristic in the circuit. For example, if the battery voltage 1902 drops to half of its full value, the time constant lengthens. The amount that the time constant is lengthened is approximately the amount required to bring the peak current through the inductor 1906 to a nominal predetermined value. In this way, the circuit is insensitive to variations in the battery voltage 1902.

Figure 20:
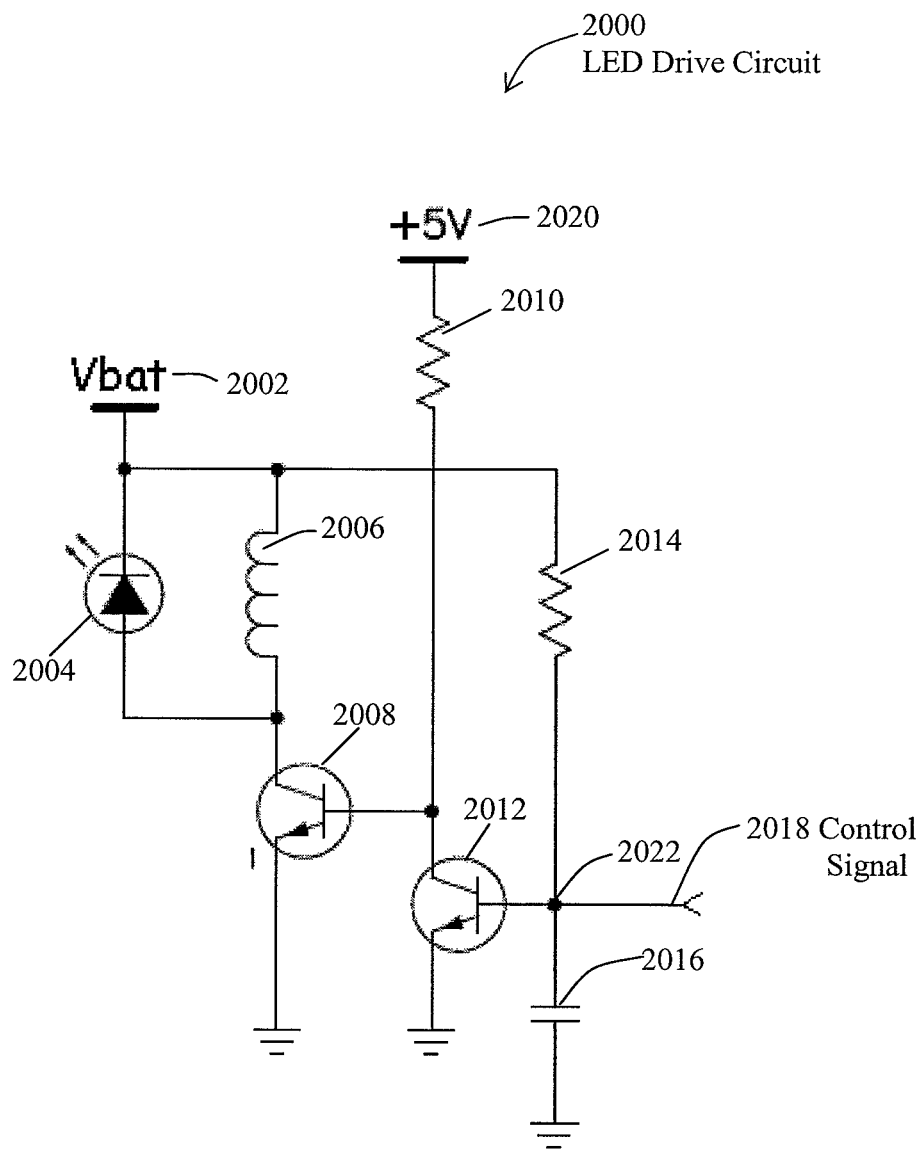
FIG. 20 is a schematic circuit diagram of another embodiment of an LED drive circuit.

FIG. 20 is another embodiment of a LED drive circuit 2000. As shown in FIG. 20, a transistor 2008 is used instead of a FET transistor. The transistors 2008, 2012 can be purchased in a dual package at very low cost. The circuit of FIG. 20, however, is not capable of delivering the high average currents that can be provided by the circuit illustrated in FIG. 19. The circuit of FIG. 20 operates in the same fashion as the circuit of FIG. 19. Control signal 2018 briefly discharges capacitor 2016 at 38 kHz. The duration of the discharge signal is much short than other time constants in the circuit. After the discharge pulse is removed, capacitor 2016 begins to charge from current supplied by resistor 2014 that is connected to the battery source 2002. For a fixed period of time, the voltage on the capacitor 2016 increases until it reaches the turn-on threshold of transistor 2012. During this interval, the transistor 2012 is turned off. As such, the collector voltage of transistor 2012 rises to 5 volts, which turns on the transistor 2008. When transistor 2008 is turned on, the current in the inductor 2006 increases linearly. When the voltage on capacitor 2016 rises to the turn-on threshold of transistor 2012, transistor 2012 turns on and causes transistor 2008 to turn off. When transistor 2008 turns off, the current in inductor 2006 discharges through the infrared LED 2004 with a high voltage pulse. The amount of time that the current passes through the infrared LED 2004 is determined by the voltage drop across the infrared LED 2004, the value of the inductor 2006 and the peak current obtained from the inductor 2006 when transistor 2008 turns off.

The embodiments of FIGS. 19 and 20 work acceptably down to battery voltages of 0.8 volts. In that manner, virtually all of the energy stored in a typical alkaline battery can be utilized to drive the LED 2004. In that regard, typical LED drive circuits are less efficient and cannot extract as much energy from the cell. For the purpose of simplicity in a comparative analysis, it is assumed that the infrared LED is driven at a carrier frequency with no modulation. Assume that a prior art controller operates using 4 AA batteries connected in series to provide a nominal voltage of 6 volts. Also, assume that the average current $I_{avg}$ equals 85 milliamps and the duty cycle D equals 0.5. Also, assume that the voltage drop across the infrared LED is 1.3 volts.

In this example, the average power delivered to the infrared LED by a prior device is 110.5 milliwatts. The power delivered by the batteries is 510 milliwatts. The amplitude of the fundamental components of the driving circuit that is given by Equation 6 is 108.2 milliamps. The average current is 85 milliamps. Utilizing the circuit of FIG. 19, assume a single AAA cell is used that provides a supply voltage of 1.5 volts. Also, assume that an inductor is chosen so that the duty cycle is 0.1. The average infrared LED current is chosen to be 55 milliamps. In this instance, the power delivered by the battery equals the power delivered to the infrared LED, which is equal to 71.5 milliwatts. The amplitude of the fundamental component of the infrared LED drive current is 108.2 milliamps. The average battery current is 48 milliamps.

In this example, the circuit of FIG. 19 uses 71.5 milliwatts to provide the same performance as the prior art, which draws 510 milliwatts of power from the battery. The circuit of FIG. 19 is approximately seven times more efficient than such a prior art device.

Further, the embodiments of FIGS. 19 and 20 are capable of operating from a very low voltage primary power source, such as a single alkaline primary battery. The concepts disclosed with regard to FIGS. 19 and 20 are not limited to applications that use only a single alkaline cell as input power and can be modified for many different applications.

Hence, the use of short pulses with a low duty cycle, the elimination of a current limiting resistor that applied in series to a LED, the boost created by the energy stored in an inductor and the ability to use a single cell to a very low voltage, so that most of the energy of the cell can be utilized, provides clear advantages over the prior art.

The foregoing description of the invention has been presented for purposes of illustration and description. It is not intended to be exhaustive or to limit the invention to the precise form disclosed, and other modifications and variations may be possible in light of the above teachings. The embodiment was chosen and described in order to best explain the principles of the invention and its practical application to thereby enable others skilled in the art to best utilize the invention in various embodiments and various modifications as are suited to the particular use contemplated. It is intended that the appended claims be construed to include other alternative embodiments of the invention except insofar as limited by the prior art.

What is claimed is:

1. A variable capacitor comprising:
a printed circuit board having a predetermined dielectric coefficient;
a metal pad disposed on a first side of said printed circuit board;
a metal cantilever disposed on a second side of said printed circuit board that is attached to said printed circuit board at a first end of said metal cantilever, said metal cantilever having a predetermined elasticity;
a deflector disposed to engage said metal cantilever so that said predetermined elasticity of said deflector is sufficient to hold said deflector in a neutral position when a deflection force is not applied to said deflector, and disposed to deflect said metal cantilever when a force is applied to said deflector which causes said metal cantilever to deflect away from said printed circuit board in a curvature that produces a progressive, measurable charge in capacitance over a full range of deflection of said deflector.

2. The variable capacitor of claim 1 further comprising:
a direction contact disposed in said printed circuit board that is engaged by said deflector to indicate a direction of movement of said deflector.

3. The variable capacitor of claim 1 further comprising:
a joystick coupled to said deflector to control movement of said deflector.

4. A remote control comprising:
a variable capacitor comprising:
a substrate;
a metal pad disposed on a first side of said substrate, and
a metal cantilever disposed on a second side of said substrate;
at least one deflector having a deflector portion that engages said metal cantilever and causes said metal cantilever to deflect from said substrate in curved shape;
an electronic controller that generates a discharge signal and a periodic charge signal that is applied to said variable capacitor;
a charge pump that accumulates a charge from periodic charge signal comprising a plurality of pulse charges that are applied to said variable capacitor up to a threshold level;
an electronic controller that generates said periodic charge signal, senses said charge accumulated by said charge pump, and generates a discharge signal that discharges said charge pump when said charge pump reaches aid threshold level, and counts plurality of pulse charges of said periodic charge signal to charge said charge pump to said threshold level, to create an output control signal;
an output generator that generates a remote control signal in response to said output control signal.

5. The remote control of claim 4 further comprising:
a direction contact disposed in said printed circuit board that is engaged by said deflector to indicate a direction of movement of said deflector.

6. The remote control of claim 4 further comprising:
a joystick coupled to said deflector to control movement of said deflector.

7. The remote control of claim 4 wherein said charge pump comprises a transistor and a diode connected in parallel.

8. A method of generating a control signal in a remote controller comprising:
deflecting a metal cantilever in a variable capacitance device using a deflector that is coupled to a manual control to adjust capacitance of said variable capacitance device;
applying a periodic waveform to said variable capacitance device so that a charge signal is created for each pulse of said periodic waveform;
integrating said charge signal for each pulse until a plurality of charge signals creates a cumulative charge signal;
detecting when said cumulative charge signal reaches a threshold charge;
counting said plurality of charge signals to generate an output signal that is indicative of said capacitance of said variable capacitance device and deflection of said deflector.

9. The method of claim 8 further comprising:
detecting a direction of movement of said deflector using a direction contact that is engaged by said deflector.

10. The method of claim 8 further comprising:
coupling a joystick to said deflector to allow a user to control movement of said deflector.

11. The method of claim 8 wherein said process creating a charge signal comprises:
using a charge pump to create said charge signal.

12. A system for generating a control signal in a remote controller comprising:
means for deflecting a metal cantilever in a variable capacitance device to adjust capacitance of said variable capacitance device;

means for generating a charge signal by applying a periodic waveform to said variable capacitance device;

means for integrating said charge signal until a plurality of charge signals creates a cumulative charge signal;

means for detecting when said cumulative charge signal reaches a threshold charge;

means for counting said plurality of charge signals to generate an output signal that is indicative of said capacitance of said variable capacitance device and deflection of said deflector.

13. A method of generating an efficient drive signal to drive an LED in an LED drive circuit that is powered by a battery comprising:

storing energy from said battery in an inductor by allowing a current to flow from said battery through said inductor to ground potential;

periodically interrupting said current flow through said inductor and directing said said current flow to said LED to create a high voltage pulse having a predetermined duration;

selecting said predetermined duration by selecting an inductive value for said inductor and a peak current generated by said inductor when said current flow through said inductor is interrupted so that a series of short duration, high voltage pulses are generated that have low duty cycles that increase efficiency of said drive signal.

14. The method of claim 13 wherein said process of periodically interrupting said circuit flow through said inductor further comprises:

using an FET switch to periodically interrupt said current.

15. The method of claim 13 wherein said process of periodically interrupting said circuit flow through said inductor further comprises:

using a bipolar transistor to periodically interrupt said current.

16. The method of claim 14 further comprising:

using a transistor switch that is connected to a pulse modulation signal to turn said FET switch on and off.

17. An LED drive current that is powered by a battery that generates a high efficiency LED drive signal comprising:

an LED that is connected to said battery;

an inductor connected in parallel to said LED so that current flows through said inductor from said battery;

a transistor switch connected to a common connection of said LED and said inductor and a ground potential;

a controller that generates a periodic signal that is applied to said FET switch to turn said FET switch off and on and periodically interrupts said current that flows through said inductor so that said current flows through said LED in the form of a short duration pulse with a low duty cycle, said duration of said pulse and said efficiency of said LED drive signal being dependent upon an inductive value of said inductor and a voltage level of said battery.

18. The LED drive circuit of claim 17 wherein said controller comprises a transistor switch that is connected to a pulse modulation sign.

19. The LED drive circuit of claim 17 wherein said transistor switch comprises an FET transistor.

20. The LED drive circuit of claim 17 wherein said transistor switch comprises a bipolar transistor.

21. A system for generating an efficient drive signal to drive an LED comprising:

inductive means for storing energy from a battery by allowing a current to flow from said battery through said inductive means to a ground potential;

means for periodically interrupting said current flow through said inductor and directing said current flow to said LED to create a high voltage pulse having a predetermined duration by selecting an inductive value for said inductive means and a peak current generated by said inductive means when said current flow through said inductor is interrupted, so that a series of short duration, high voltage pluses are generated that have low duty cycles to increase the efficiency of said drive signal.

22. A method of generating a step-up voltage in a circuit that is powered by a battery comprising:

using a pair of transistors that are connected to form a bistable oscillator;

using an inductor to store energy from said battery;

periodically coupling said inductor to an output capacitor after said inductor has reached a predetermined current load using one of said transistors of said pair of transistors that form said bistable oscillator;

storing said energy from said inductor on an output capacitor.

23. The method of generating a step-up voltage of claim 22 further comprising:

using a zener diode to limit a drive current from said inductor that charges said capacitor.

24. A step-up converter that generates a step-up voltage in a battery powered circuit comprising:

a pair of transistors connected to form a bistable oscillator;

an inductor connected to said bistable oscillator so that current flows through said inductor from said battery into said bistable oscillator and said bistable oscillator periodically interrupts said current flow into said bistable oscillator;

an output capacitor that charges to said step-up voltage;

a diode that directs said current flow to said output capacitor when said current flow is interrupted from flowing into said bistable oscillator.

25. The step-up converter of claim 24 further comprising:

a zener diode that limits the drive current applied to said output capacitor to regulate said step-up voltage on said output capacitor.

26. A system for generating a step-up voltage in a circuit that is powered by a battery comprising:

means for generating a bistable oscillator;

means for using an inductor to store energy from said battery;

means for periodically coupling said inductor to an output capacitor after said inductor has reached a predetermined current level using said bistable oscillator;

means for storing said energy from said inductor to produce said step-up voltage.

* * * * *